(12) United States Patent
Sasaki et al.

(10) Patent No.: US 8,933,326 B2
(45) Date of Patent: Jan. 13, 2015

(54) MULTIJUNCTION COMPOUND SEMICONDUCTOR SOLAR CELL

(75) Inventors: Kazuaki Sasaki, Osaka (JP); Takaaki Agui, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 169 days.

(21) Appl. No.: 13/518,563

(22) PCT Filed: Dec. 27, 2010

(86) PCT No.: PCT/JP2010/073572
§ 371 (c)(1),
(2), (4) Date: Jun. 22, 2012

(87) PCT Pub. No.: WO2011/078378
PCT Pub. Date: Jun. 30, 2011

(65) Prior Publication Data
US 2012/0247547 A1   Oct. 4, 2012

(30) Foreign Application Priority Data

Dec. 25, 2009  (JP) ................. 2009-294377

(51) Int. Cl.
*H01L 31/0304* (2006.01)
*H01L 31/0687* (2012.01)
*H01L 31/18* (2006.01)

(52) U.S. Cl.
CPC .... *H01L 31/03046* (2013.01); *H01L 31/06875* (2013.01); *H01L 31/1844* (2013.01); *Y02E 10/544* (2013.01)
USPC ......................................... 136/255

(58) Field of Classification Search
CPC ............ H01L 31/03046; H01L 31/078; H01L 31/022425; H01L 31/06875; H01L 31/1844; Y02E 10/544
USPC ......................................... 136/255
See application file for complete search history.

(56) References Cited

U.S. PATENT DOCUMENTS 6,300,558 B1   10/2001  Takamoto et al.
6,864,414 B2   3/2005   Sharps et al.
(Continued)

FOREIGN PATENT DOCUMENTS

JP   63-193546      8/1988
JP   2007-324563   12/2007
(Continued)

OTHER PUBLICATIONS

Nahory et al., "Band gap versus composition and demonstration of Vegard's law for In1-xGaxAsyP1-y lattice matched to InP", Applied Physics Letters, vol. 33 (7), (Oct. 1978), pp. 659-661.*
(Continued)

*Primary Examiner* — Jeffrey T Barton
*Assistant Examiner* — Tae-Sik Kang
(74) *Attorney, Agent, or Firm* — Nixon & Vanderhye, P.C.

(57) ABSTRACT

Disclosed is a multijunction compound semiconductor solar cell having a buffer layer between a first cell and a second cell. In the buffer layer, a plurality of semiconductor layers is arranged such that lattice constants thereof have larger values in order from the first cell side to the second cell side. Of the plurality of semiconductor layers, two layers having the largest difference in lattice constant among each two adjacent layers are disposed closer to the first cell than the center in the thickness direction of the buffer layer.

5 Claims, 17 Drawing Sheets

(56) References Cited

U.S. PATENT DOCUMENTS

| | | |
|---|---|---|
| 7,488,890 B2 | 2/2009 | Takamoto et al. |
| 2003/0136442 A1 | 7/2003 | Takamoto |
| 2004/0079408 A1* | 4/2004 | Fetzer et al. ............... 136/262 |
| 2004/0187912 A1 | 9/2004 | Takamoto et al. |
| 2004/0206389 A1 | 10/2004 | Takamoto et al. |
| 2005/0274411 A1 | 12/2005 | King et al. |
| 2006/0054900 A1 | 3/2006 | Takamoto et al. |
| 2006/0055000 A1* | 3/2006 | Sawada et al. ............... 257/613 |
| 2006/0180198 A1 | 8/2006 | Takamoto et al. |
| 2007/0137698 A1 | 6/2007 | Wanlass et al. |
| 2007/0199592 A1 | 8/2007 | Agui et al. |
| 2007/0277873 A1 | 12/2007 | Cornfeld et al. |
| 2008/0070388 A1 | 3/2008 | Takamoto et al. |
| 2008/0190479 A1 | 8/2008 | Hsieh et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0229659 A1 | 9/2009 | Wanlass et al. |
| 2010/0229932 A1 | 9/2010 | Cornfeld et al. |
| 2011/0290312 A1 | 12/2011 | Agui et al. |

FOREIGN PATENT DOCUMENTS

| | | |
|---|---|---|
| JP | 2009-076920 | 4/2009 |
| JP | 2009-141135 | 6/2009 |
| JP | 2010-182951 | 8/2010 |
| WO | WO 2010/090170 | 8/2010 |

OTHER PUBLICATIONS

Office Action issued in U.S. Appl. No. 13/148,270 dated Apr. 18, 2013.

Geisz, J.F., et al., "In situ Measurement for MOVPE Growth of High Efficiency Lattice-Mismatched Solar Cells," Journal of Crystal Growth 3010, pp. 2339-2344, 2008.

Office Action issued in U.S. Appl. No. 13/148,270 dated Mar. 7, 2013.

International Search Report for PCT/JP2010/073572 mailed Jan. 25, 2011.

J.F. Gaisz et al., "High Efficiency GaInP/GaAs/InGaAs Triple-Junction Solar Cells Grown Inverted with a Matamorphic Bottom Junction", Applied Physics Letters, vol. 91, No. 2, 2007, 3 pages.

M.W. Wanlass et al., "Lattice-Mismatched Approaches for High-Performance, III-V, Photovoltaic Energy Converters", Conf. Rec. IEEE Photovoltais Spec. Conf., 2005, vol. 31, pp. 530-535.

J.F. Gaisz et al., "Inverted GaInP/(In)GaAs/InGaAs Triple-Juction Solar Cells with Low-Stress Metamorphic Bottom Junction", 3rd IEEE Photovoltaic Specialists Conference, May 11-16, 2008, 5 pages.

Office Action issued in U.S. Appl. No. 13/148,270 dated Aug. 6, 2013.

Office Action mailed Sep. 22, 2014 in U.S. Appl. No. 14/073,524.

* cited by examiner (a)     (b)

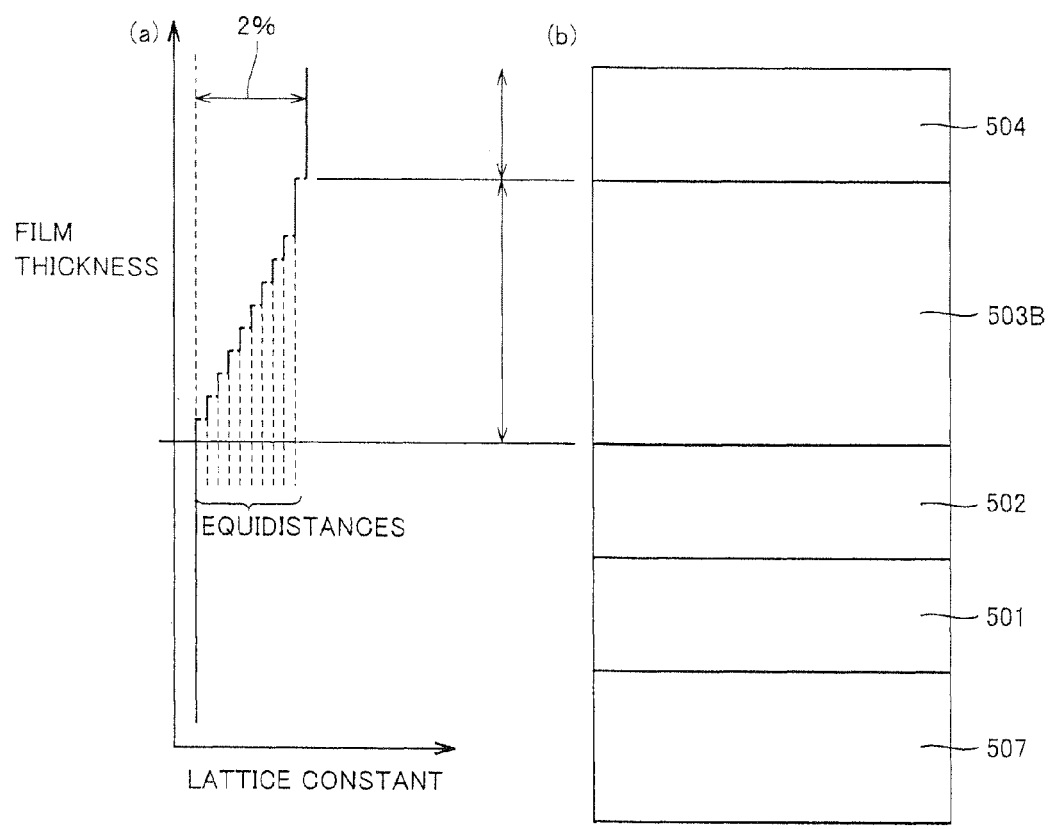

MULTIJUNCTION COMPOUND SEMICONDUCTOR SOLAR CELL

This application is the U.S. national phase of International Application No. PCT/JP2010/073572 filed 27 Dec. 2010 which designated the U.S. and claims priority to JP 2009-294377 filed 25 Dec. 2009, the entire contents of each of which are hereby incorporated by reference.

TECHNICAL FIELD

The present invention relates to multijunction compound semiconductor solar cells.

BACKGROUND ART

Mainly used solar cells nowadays are silicon crystalline solar cells using silicon substrates having PN junctions on the silicon substrates. Meanwhile, compound semiconductor solar cells using direct bandgap compound semiconductors with large optical absorption coefficients provide for higher photoelectric conversion efficiency than crystalline silicon solar cells. Many of the compound semiconductor solar cells currently under development are multijunction compound semiconductor solar cells with a multijunction (tandem) structure having a plurality of photoelectric conversion layers (PN junction layers) with bandgaps that are different from one another. Having ability of effectively using solar light spectra, this kind of solar cells allows for higher photoelectric conversion efficiency than single junction compound semiconductor solar cells with single photoelectric conversion layer.

Currently under active study for multijunction compound semiconductor solar cells having a plurality of photoelectric conversion layers with bandgaps different from one another is a system with which lattice match by means of epitaxial growth is taken into consideration, i.e., a lattice-matched system. With respect to the lattice-matched system, a multijunction compound semiconductor solar cell with three photoelectric conversion layers has been developed which includes an InGaP photoelectric conversion layer/a GaAs photoelectric conversion layer/a Ge photoelectric conversion layer from the side on which solar light is to be incident (a light receiving surface side). The bandgap of the InGaP photoelectric conversion layer is about 1.87 eV, the bandgap of the GaAs photoelectric conversion layer is about 1.42 eV, and the bandgap of the Ge photoelectric conversion layer is about 0.67 eV.

Outline cross-sectional views of multijunction compound semiconductor solar cells of related art are depicted in FIGS. 16(a) and 16(b). The multijunction compound semiconductor solar cell depicted in FIG. 16(a) has a top cell 501, a middle cell 502, and a bottom cell 504 that are arranged in this order from the solar light incident side. Top cell 501 on the light receiving surface side has on a surface thereof a first electrode 505, and bottom cell 504 on the side opposite the light receiving surface side (i.e., a back surface side) has on a back surface thereof a second electrode 506. The photoelectric conversion layer of top cell 501 has the largest bandgap, the photoelectric conversion layer of middle cell 502 has the second largest bandgap, and the photoelectric conversion layer of bottom cell 504 has the smallest bandgap.

As depicted in FIG. 16(a), solar light enters from the side of top cell 501 and propagates toward bottom cell 504. During the propagation, the photoelectric conversion layers of top cell 501, middle cell 502, and bottom cell 504 allow wavelengths of the solar light to be absorbed therein based on their respective bandgaps, so as to effect conversion (photoelectric conversion) into electric energy. It is to be noted here that top cell 501, middle cell 502, and bottom cell 504 each comprise a plurality of semiconductor layers including one photoelectric conversion layer.

To effectively utilize solar light spectra in the triple-junction multijunction compound semiconductor solar cell of top cell 501/middle cell 502/bottom cell 504 as depicted in FIG. 16(a), it is considered that a desirable material combination is such that the respective photoelectric conversion layers of the cells have bandgaps of 1.93 eV/1.42 eV/1.05 eV from the light receiving surface side. In order to obtain a multijunction compound semiconductor solar cell with higher photoelectric conversion efficiency, considered as a material for bottom cell 504 is a material that allows the photoelectric conversion layer of bottom cell 504 to have a bandgap on the order of 0.9 to 1.1 eV.

InGaAs is proposed as one of the materials that have a bandgap on the order of 1 eV. In the case where InGaAs is used as a material of bottom cell 504, InGaP is used for top cell 501, and GaAs is used as a material of middle cell 502 to fabricate a multijunction compound semiconductor solar cell, GaAs constituting middle cell 502 is different in lattice constant from InGaAs constituting bottom cell 504, and the difference in lattice constant is as large as about 2%. Thus, as depicted in FIG. 16(b), a multijunction compound semiconductor solar cell is under development which has a buffer layer 503 with varied lattice constants disposed between middle cell 502 and bottom cell 504.

Non-patent Literature 1 (J. F. Geisz, et al., "Inverted GaInP/(In)GaAs/InGaAs triple-junction solar cells with low-stress metamorphic bottom junction", 33rd IEEE Photovoltaic Specialists Conference San Diego, Calif., May 11-16, 2008) discloses a multijunction compound semiconductor solar cell including InGaP (the top cell)/GaAs (the middle cell)/InGaAs (the bottom cell), wherein top cell 501 (InGaP) and middle cell 502 (GaAs) are lattice-matched, while a buffer layer 503 having varied InGaP lattice constants is disposed between middle cell 502 (GaAs) and bottom cell 504 (InGaAs) that are different in lattice constant.

FIG. 17(a) depicts a relationship between the lattice constant and the film thickness of the related art where a multijunction compound semiconductor solar cell is formed on a semiconductor substrate 507 (a GaAs substrate) as depicted in the outline cross-sectional view of FIG. 17(b). FIG. 18(a) depicts a relationship between the lattice constant and the film thickness of the related art where a multijunction compound semiconductor solar cell is formed on a semiconductor substrate 507 (a GaAs substrate) as depicted in the outline cross-sectional view of FIG. 18(b). The multijunction compound semiconductor solar cells on the semiconductor substrates 507 (the GaAs substrates) that are depicted in FIGS. 17(b) and 18(b) are fabricated in the following manner. In FIGS. 17 and 18, illustration is not given of tunnel junction.

First, InGaP crystal that is lattice-matched with the GaAs crystal constituting a semiconductor substrate 507 is epitaxially grown on semiconductor substrate 507 (the GaAs substrate), so as to form a top cell 501, and then GaAs crystal that is lattice-matched with the InGaP crystal constituting top cell 501 is epitaxially grown, so as to form a middle cell 502.

Next, InGaP crystal is epitaxially grown to form a buffer layer 503A in such a manner that the lattice constants thereof increase at equidistances (the lattice constants increment by a constant amount of increase). Subsequently, InGaAs crystal is epitaxially grown to form a bottom cell 504, such that a multijunction compound semiconductor solar cell wafer is fabricated.

As depicted in FIG. 17(a), in the multijunction compound semiconductor solar cell wafer depicted in FIG. 17(b), the lattice constants of the InGaP crystal of buffer layer 503A, which crystal being adjacent bottom cell 504, is larger than the lattice constant of bottom cell 504.

Further, as depicted in FIG. 18(a), in the formation of the multijunction compound semiconductor solar cell on semiconductor substrate 507 (the GaAs substrate) that is depicted in FIG. 18(b), the lattice constant of InGaP crystal of buffer layer 503B, which crystal being adjacent bottom cell 504, is smaller than the lattice constant of bottom cell 504. Similar description is found in Patent Literature 1 (Japanese Patent Laying-Open No. 2007-324563).

FIGS. 17(b) and 18(b) exemplarily depict a method referred to as an invert fabrication process wherein cells are stacked on semiconductor substrate 507 in order from the cell disposed on the light receiving surface side of the multijunction compound semiconductor solar cell, namely, in the order of top cell 501, middle cell 502, and bottom cell 504, and such a laminate structure is referred to as an "inverted triple junction".

CITATION LIST

Patent Literature

PTL 1: Japanese Patent Laying-Open No. 2007-324563

Non Patent Literature

NPL 1 J. F. Geisz, et al., "Inverted GaInP/(In)GaAs/InGaAs triple-junction solar cells with low-stress metamorphic bottom junction.", 33rd IEEE Photovoltaic Specialists Conference San Diego, Calif., May 11-16, 2008

SUMMARY OF INVENTION

Technical Problem

However, in the multijunction compound semiconductor solar cell taught in Non-patent Document 1, although buffer layer 503 with varied InGaP lattice constants is formed between middle cell 502 (GaAs) and bottom cell 504 (InGaAs) that are different in lattice constant, crystallinity of the crystal constituting buffer layer 503 and bottom cell 504 is not enhanced to a satisfactory level, and hence a multijunction compound semiconductor solar cell with favorable characteristics has not been achieved.

In view of the foregoing circumstances, an object of the present invention is to provide a multijunction compound semiconductor solar cell with improved characteristics.

Solution to Problem

The present invention relates to a multijunction compound semiconductor solar cell, including: a first electrode; a first cell; a buffer layer; a second cell; and a second electrode. The first electrode is disposed on a side on which solar light is to be incident. The first cell includes a first photoelectric conversion layer. The second cell includes a second photoelectric conversion layer. The first photoelectric conversion layer is different in bandgap from the second photoelectric conversion layer. The second cell is larger in lattice constant than the first cell. The buffer layer includes a plurality of semiconductor layers. The plurality of semiconductor layers is arranged such that lattice constants thereof have larger values in order from the side of the first cell to the side of the second cell. Of the plurality of semiconductor layers, a semiconductor layer closest to the second cell is larger in lattice constant than the second cell. Of the plurality of semiconductor layers, two layers having the largest difference in lattice constant among each two adjacent layers are at a position closer to the first cell than the center in the thickness direction of the buffer layer.

In the multijunction compound semiconductor solar cell of the present invention, the two layers having the largest difference in lattice constant among each two adjacent semiconductor layers are preferably two layers closest to the first cell.

In the multijunction compound semiconductor solar cell of the present invention, where, of the two layers having the largest difference in lattice constant among each two adjacent semiconductor layers, the semiconductor layer on the side of the second cell has a lattice constant a1, and the semiconductor layer on the side of the first cell has a lattice constant a2, difference in lattice constant between lattice constant a1 and lattice constant a2 is preferably greater than or equal to 0.0015 nm and less than or equal to 0.0026 nm.

In the multijunction compound semiconductor solar cell of the present invention, where the second photoelectric conversion layer of the second cell has a lattice constant a4, and the semiconductor layer closest to the second cell has a lattice constant a3, and a second ratio of difference in lattice constant (%)=(100×(a3−a4))/(a3), the second ratio of difference in lattice constant is preferably greater than or equal to 0.12% and less than or equal to 0.8%.

The present invention further relates to a multijunction compound semiconductor solar cell, including: a first cell having a first photoelectric conversion layer with a first bandgap; a second cell having a second photoelectric conversion layer with a second bandgap that is smaller than the first bandgap, a buffer layer between the first cell and the second cell; a first electrode disposed on the side of the first cell; and a second electrode disposed on the side of the second cell. The second cell is larger in lattice constant than the first cell. The buffer layer includes a plurality of semiconductor layers. The plurality of semiconductor layers is arranged such that lattice constants thereof have larger values in order from the side of the first cell to the side of the second cell. Of the plurality of semiconductor layers, a semiconductor layer closest to the second cell is larger in lattice constant than the second cell. Of the plurality of semiconductor layers, two layers having the largest difference in lattice constant among each two adjacent layers are at a position closer to the first cell than the center in the thickness direction of the buffer layer.

In the multijunction compound semiconductor solar cell of the present invention, the two layers having the largest difference in lattice constant among each two adjacent semiconductor layers are preferably two layers closest to the first cell.

In the multijunction compound semiconductor solar cell of the present invention, where, of the two layers having the largest difference in lattice constant among each two adjacent semiconductor layers, the semiconductor layer on the side of the second cell has a lattice constant a1, and the semiconductor layer on the side of the first cell has a lattice constant a2, difference in lattice constant between lattice constant a1 and lattice constant a2 is preferably greater than or equal to 0.0015 nm and less than or equal to 0.0026 nm.

In the multijunction compound semiconductor solar cell of the present invention, where the second photoelectric conversion layer of the second cell has a lattice constant a4, and the semiconductor layer closest to the second cell has a lattice constant a3, and a second ratio of difference in lattice constant (%)=(100×(a3−a4))/(a3), the second ratio of difference in lattice constant is preferably greater than or equal to 0.12% and less than or equal to 0.8%.

Advantageous Effects of Invention

According to the present invention, a multijunction compound semiconductor solar cell with improved characteristics is available.

BRIEF DESCRIPTION OF DRAWINGS

FIG. 18(a) depicts a relationship between the lattice constant and the film thickness of a multijunction compound semiconductor solar cell wafer of the related art that is depicted in FIG. 18(b), where FIG. 18(b) is an outline cross-sectional view of the multijunction compound semiconductor solar cell wafer of the related art.

DESCRIPTION OF EMBODIMENTS

Figure 1:
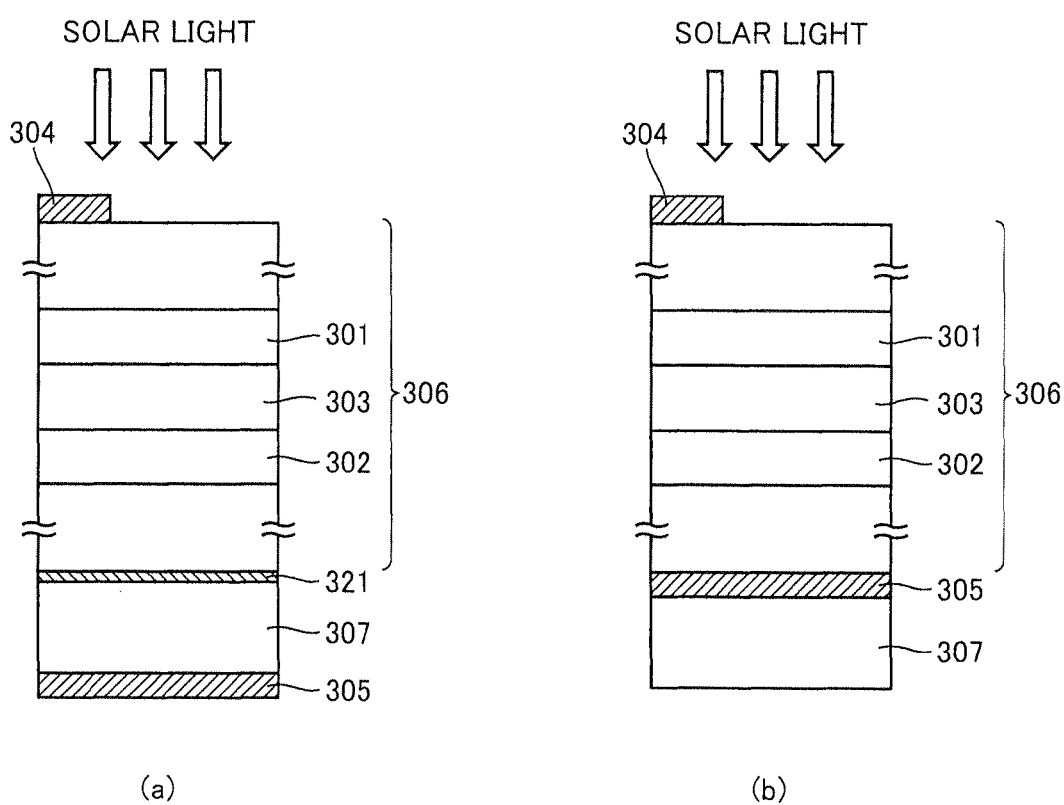
FIGS. 1(a) and 1(b) are exemplary diagrams of basic structures of a multijunction compound semiconductor solar cell of the present invention.

Embodiments of the present invention are described below. In the drawings of the present invention, like reference numerals denote like portions or corresponding portions.

FIG. 1(a) exemplarily depicts a basic structure of a multijunction compound semiconductor solar cell of one embodiment of the present invention. The multijunction compound semiconductor solar cell depicted in FIG. 1(a) includes a multijunction cell 306, a supporting substrate 307, a metal layer 321 joining multijunction cell 306 with supporting substrate 307, a first electrode 304 disposed on the light receiving surface side of multijunction cell 306, and a second electrode 305 disposed on the side of a back surface of supporting substrate 307. Multijunction cell 306 includes a first cell 301, a second cell 302 that is different in lattice constant from first cell 301, and a buffer layer 303 disposed between first cell 301 and second cell 302. Multijunction cell 306 may include a single or plurality of cell(s) in addition to first cell 301 and second cell 302. Exemplary supporting substrates 307 include a semiconductor substrate.

FIG. 1(b) exemplarily depicts another basic structure of the multijunction compound semiconductor solar cell of one embodiment of the present invention. The multijunction compound semiconductor solar cell depicted in FIG. 1(b) has a feature that second electrode 305 is disposed between multijunction cell 306 and supporting substrate 307.

In the multijunction compound semiconductor solar cells depicted in FIGS. 1(a) and 1(b), first cell 301 is disposed closer to the light receiving surface side than second cell 302, and a first photoelectric conversion layer of first cell 301 has a larger bandgap (a first bandgap) than the bandgap (a second bandgap) of a second photoelectric conversion layer of second cell 302. Further, the second photoelectric conversion layer of second cell 302 is larger in lattice constant than the first photoelectric conversion layer of first cell 301. Moreover, buffer layer 303 has a bandgap (a third bandgap) that is larger than the second bandgap.

Buffer layer 303 comprises a plurality of semiconductor layers that have lattice constants different from one another, between two cells in which the respective photoelectric conversion layers thereof have different lattice constants. The lattice constants of the semiconductor layers of buffer layer 303 are varied so as to be larger in order from the first cell 301 side to the second cell 302 side.

The multijunction compound semiconductor solar cells depicted in FIGS. 1(a) and 1(b) are fabricated by forming first cell 301 on the light receiving surface side of the multijunction compound semiconductor solar cell, followed by forming buffer layer 303 and then second cell 302. The semiconductor layers configuring buffer layer 303 are formed by epitaxial growth with the composition ratio of group III elements of compound semiconductors varied so as to have gradually increasing lattice constants from the first cell 301 side to the second cell 302 side.

A plurality of semiconductor layers that has lattice match with first cell 301 may be formed by epitaxial growth between first cell 301 and buffer layer 303. A plurality of semiconductor layers that has lattice match with second cell 302 may be formed by epitaxial growth between second cell 302 and buffer layer 303.

In the case that, of the plurality of semiconductor layers configuring buffer layer 303, a semiconductor layer that is closest to second cell 302 has a larger lattice constant than the lattice constant of the second photoelectric conversion layer of second cell 302, and also that two adjacent layers closer to first cell 301 than the center in the thickness direction of buffer layer 303 have a difference in lattice constant that is larger than the difference in lattice constant between the other two adjacent layers, it was found that a second cell 302 with less crystal defect is producible, and that the crystallinity of second cell 302 is improved. It was also found that improvement in crystallinity of second cell 302 leads to improvement in characteristic of second cell 302, hence improvement in photovoltaic characteristic of the multijunction compound semiconductor solar cell.

Conceivable reason therefor is as follows: in the case that the difference in lattice constant between two adjacent layers in buffer layer 303 having a plurality of semiconductor layers is set to be greater than or equal to a certain value, crystal growth that has transited from two-dimensional growth to three-dimensional growth slightly takes place, in addition to a phenomenon of occurrence of dislocation, in the semiconductor layer on the second cell 302 side of the two adjacent layers, and the three-dimensional growth that has slightly occurred reduces distortion in the semiconductor layer on the second cell 302 side and enhances the crystallinity.

Thus, by inducing this reduction in distortion at a portion that is closer to the first cell 301 side than the semiconductor layer located at the center in the thickness direction within buffer layer 303, a semiconductor layer with better crystallinity is producible on the first cell 301 side, and by stacking a semiconductor layer on that semiconductor layer, crystallinity of second cell 302 is improved.

Figure 2:
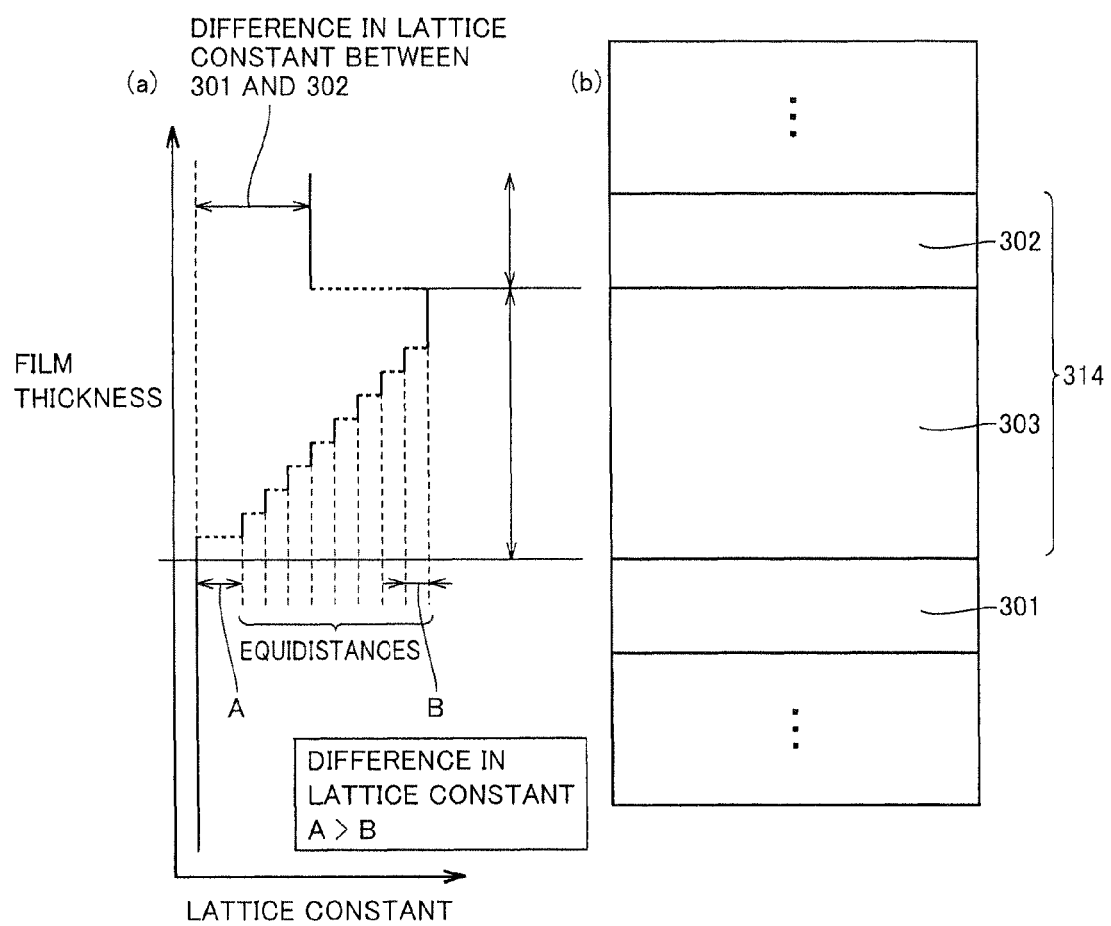
FIG. 2(a) depicts a relationship between the lattice constant and the film thickness of an exemplary multijunction compound semiconductor solar cell of the present invention that is depicted in FIG. 2(b), where
FIG. 2(b) is an outline cross-sectional view of the exemplary multijunction compound semiconductor solar cell of the present invention.

FIG. 2(a) depicts a relationship between the lattice constant and the film thickness of an exemplary multijunction compound semiconductor solar cell of one embodiment of the present invention that is depicted in the outline cross-sectional view of FIG. 2(b). Herein, of the plurality of semiconductor layers configuring buffer layer 303, two layers with the largest difference in lattice constant among each two adjacent semiconductor layers are two layers closest to first cell 301. It is to be noted here that the second photoelectric conversion layer of second cell 302 has a larger lattice constant than the lattice constant of the first photoelectric conversion layer of first cell 301. Further, of the semiconductor layers configuring buffer layer 303, the difference A in lattice constant between the two adjacent layers that are located at a portion closest to first cell 301 is larger than the difference B in lattice constant between the other two adjacent layers. In FIG. 2(b), a laminate of second cell 302 and buffer layer 303 is collectively referred to as a semiconductor layer 314.

In this case, it is considered that, by inducing reduction in distortion in a portion that is closest to first cell 301 within buffer layer 303, a semiconductor layer with favorable crystallinity is formed from the portion closest to the first cell 301 side, and a semiconductor layer is stacked on that semiconductor layer, which further improves the crystallinity of second cell 302 and further enhances the characteristics of second cell 302.

Since the crystallinity of second cell 302 is improvable by providing a larger area with better crystallinity inside buffer layer 303, the two adjacent layers with the largest difference in lattice constant are preferably located closer to first cell 301 than the center in the thickness direction of buffer layer 303, especially at the position closest to first cell 301.

A tunnel junction layer may be formed in multijunction cell 306. The tunnel junction layer is a layer that provides a densely-doped PN junction for establishing electrical connection between two semiconductor layers and includes at least a pair of a P+ layer and an N+ layer.

Further, the cells including first cell 301 and second cell 302 may be provided, for example, with a window layer on the light receiving surface side or a BSF layer (a back surface field layer) on the back surface side in addition to the photoelectric conversion layers, so as to take additional measures to enhance the carrier collection efficiency. Further, a contact layer may be provided in a cell located closest to an electrode so as to reduce resistance between a semiconductor layer and the electrode.

The window layer is disposed closer to the light receiving surface side than a photoelectric conversion layer and is made of a material that provides a larger bandgap than that of the photoelectric conversion layer. Providing the window layer improves crystallinity at the interface between the window layer and the photoelectric conversion layer, and the surface recombination level is thus lowered, which is likely to increase capability of keeping carriers that has occurred within the photoelectric conversion layer.

EXAMPLES

Example 1

Figure 3:
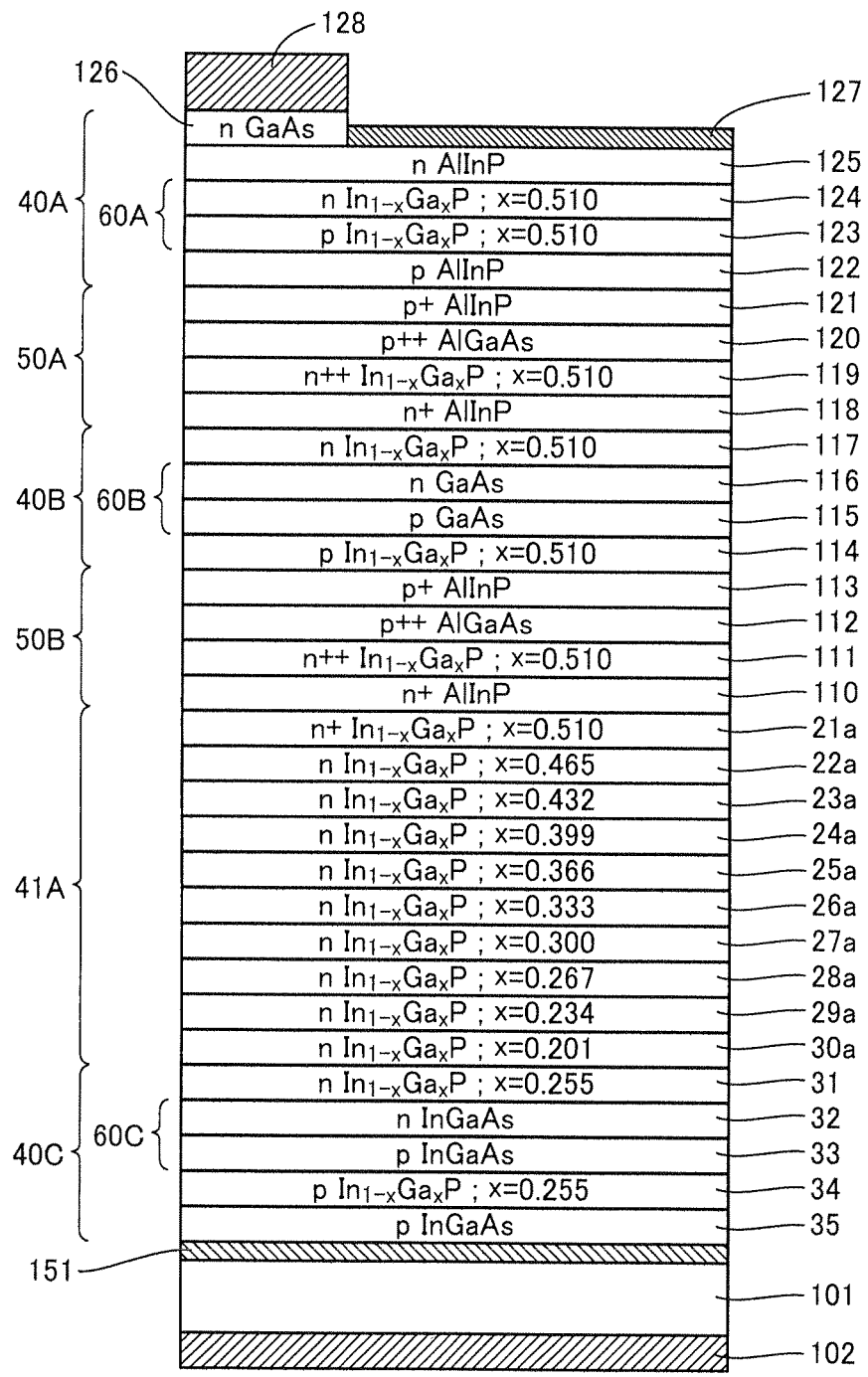
FIG. 3 depicts an exemplary specific cross-sectional structure of a multijunction compound semiconductor solar cell of Example 1.

FIG. 3 exemplarily depicts a specific cross-sectional structure of a multijunction compound semiconductor solar cell of Example 1. The multijunction compound semiconductor solar cell depicted in FIG. 3 includes, down from the side to be the light receiving surface, a top cell 40A (InGaP), a middle cell 40B (GaAs), and a bottom cell 40C (InGaAs). A photoelectric conversion layer 60B of middle cell 40B (GaAs) and a photoelectric conversion layer 60C of bottom cell 40C (InGaAs) are different in lattice constant from each other, and the difference in lattice constant is about 2%. Middle cell 40B corresponds to the first cell and bottom cell 40C corresponds to the second cell.

More specifically, the multijunction compound semiconductor solar cell depicted in FIG. 3 includes, down from the side to be the light receiving surface, a first electrode 128, top cell 40A, a tunnel junction layer (a first tunnel junction layer) 50A, middle cell 40B, a tunnel junction layer (a second tunnel junction layer) 50B, a buffer layer 41A, and bottom cell 40C in this order on a supporting substrate 101 (for example, 400 μm in thickness), and a second electrode 102 is provided on a back surface side of supporting substrate 101. A metal layer 151 is provided between bottom cell 40C and supporting substrate 101. Metal layer 151 may be formed, for example, of an alloy of gold and tin by using an apparatus such as a resistance heating evaporator or an EB (Electron Beam) evaporator. In this case, supporting substrate 101 is a semiconductor such as silicon.

Bottom cell 40C includes, from the supporting substrate 101 side in order, a contact layer 35 (for example, 0.4 μm in thickness) formed of P type InGaAs, a BSF layer 34 (for example, 0.1 μm in thickness) formed of P type $In_{0.745}Ga_{0.255}P$, a base layer 33 (for example, 3 μm in thickness) formed of P type InGaAs, an emitter layer 32 (for example, 0.1 μm in thickness) formed of N type InGaAs, and a window layer 31 (for example, 0.1 μm in thickness) formed of N type $In_{0.745}Ga_{0.255}P$. Bottom cell 40C has photoelectric conversion layer 60C constituted of a joint of base layer 33 formed of P type InGaAs with emitter layer 32 formed of N type InGaAs. Bottom cell 40C is lattice-matched thereinside.

Buffer layer 41A includes, from the bottom cell 40C side in order, an N type $In_{0.799}Ga_{0.201}P$ layer 30a (for example, 1 µm in thickness), an N type $In_{0.766}Ga_{0.234}P$ layer 29a (for example, 0.25 µm in thickness), an N type $In_{0.733}Ga_{0.267}P$ layer 28a (for example, 0.25 µm in thickness), an N type $In_{0.700}Ga_{0.300}P$ layer 27a (for example, 0.25 µm in thickness), an N type $In_{0.667}Ga_{0.333}P$ layer 26a (for example, 0.25 µm in thickness), an N type $In_{0.634}Ga_{0.366}P$ layer 25a (for example, 0.25 µm in thickness), an N type $In_{0.601}Ga_{0.399}P$ layer 24a (for example, 0.25 µm in thickness), an N type $In_{0.568}Ga_{0.432}P$ layer 23a (for example, 0.25 µm in thickness); an N type $In_{0.535}Ga_{0.465}P$ layer 22a (for example, 0.25 µm in thickness), and an N+ type $In_{0.490}Ga_{0.510}P$ layer 21a (for example, 0.25 µm in thickness). Since the lattice constant of an InGaP layer varies depending on the composition ratio of group III elements of In and Ga of the InGaP layer, the above semiconductor layers configuring of buffer layer 41A are arranged such that the lattice constants thereof increase stepwise from middle cell 40B to bottom cell 40C.

N+ type $In_{0.490}Ga_{0.510}P$ layer 21a is lattice-matched with an N+ type AlInP layer 110 to be described later, and the lattice constants increase stepwise from N type $In_{0.535}Ga_{0.465}P$ layer 22a to N type $In_{0.799}Ga_{0.201}P$ layer 30a of buffer layer 41A.

The difference in Ga composition x between N+ type $In_{0.490}Ga_{0.510}P$ layer 21a and N type $In_{0.535}Ga_{0.465}P$ layer 22a is 0.045, which is larger than the difference in Ga composition x of 0.033 between two adjacent layers of the other InGaP layers. Hence, the difference in lattice constant between N+ type $In_{0.490}Ga_{0.510}P$ layer 21a and N type $In_{0.535}Ga_{0.465}P$ layer 22a is larger than the difference in lattice constant between the other two adjacent layers configuring buffer layer 41A, and one such portion exists at a position closer to the middle cell 40B side than the center in the thickness direction of buffer layer 41A. In this case, the other two adjacent layers each have the same difference in lattice constant.

Tunnel junction layer (the second tunnel junction layer) 50B includes, from the buffer layer 41A side in order, N+ type AlInP layer 110 (for example, 0.05 µm in thickness), an N++ type $In_{0.490}Ga_{0.510}P$ layer 111 (for example, 0.02 µm in thickness), a P++ type AlGaAs layer 112 (for example, 0.02 µm in thickness), and a P+ type AlInP layer 113 (for example, 0.05 µm in thickness). Tunnel junction layer (the second tunnel junction layer) 50B is lattice-matched thereinside.

Middle cell 40B includes, from the second tunnel junction layer 50B side in order, a BSF layer 114 (for example, 0.1 µm in thickness) formed of P type $In_{0.490}Ga_{0.510}P$, a base layer 115 (for example, 3 µm in thickness) formed of P type GaAs, an emitter layer 116 (for example, 0.1 µm in thickness) formed of N type GaAs, and a window layer 117 (for example, 0.1 µm in thickness) formed of N type $In_{0.490}Ga_{0.510}P$. Middle cell 40B has photoelectric conversion layer 60B constituted of a joint of base layer 115 formed of P type GaAs with emitter layer 116 formed of N type GaAs. Middle cell 40B is lattice-matched thereinside.

Tunnel junction layer (the first tunnel junction layer) 50A includes, from the middle cell 40B side in order, an N+ type AlInP layer 118 (for example, 0.05 µm in thickness), an N++ type $In_{0.490}Ga_{0.510}P$ layer 119 (for example, 0.02 µm in thickness), a P++ type AlGaAs layer 120 (for example, 0.02 µm in thickness), and a P+ type AlInP layer 121 (for example, 0.05 µm in thickness). Tunnel junction layer (the first tunnel junction layer) 50A is lattice-matched thereinside.

Top cell 40A includes, from the first tunnel junction layer 50A side in order, a BSF layer 122 (for example, 0.05 µm in thickness) formed of P type AlInP, a base layer 123 (for example, 0.70 µm in thickness) formed of P type $In_{0.490}Ga_{0.510}P$, an emitter layer 124 (for example, 0.05 µm in thickness) formed of N type $In_{0.490}Ga_{0.510}P$, a window layer 125 (for example, 0.05 µm in thickness) formed of N type AlInP, and a contact layer 126 (for example, 0.4 µm in thickness) formed of N type GaAs, the contact layer being formed in the area where first electrode 128 is formed on window layer 125 formed of N type AlInP. Top cell 40A has a photoelectric conversion layer 60A constituted of a joint of base layer 123 formed of P type $In_{0.490}Ga_{0.510}P$ with emitter layer 124 formed of N type $In_{0.490}Ga_{0.510}P$. Top cell 40A is lattice-matched thereinside.

An antireflection film 127 of $ZnS/MgF_2$ is formed on window layer 125 formed of N type AlInP in the area other than that in which first electrode 128 is formed.

Lattice match is attained between tunnel junction layer (the second tunnel junction layer) 50B, middle cell 40B, tunnel junction layer (the first tunnel junction layer) 50A, and top cell 40A.

Where the bandgap of photoelectric conversion layer 60A in top cell 40A is a first bandgap, the bandgap of photoelectric conversion layer 60B in middle cell 40B is a second bandgap, and the bandgap of photoelectric conversion layer 60C in bottom cell 40C is a fourth bandgap, the bandgaps of the photoelectric conversion layers decrease in order from the first bandgap, the second bandgap, and the fourth bandgap. Where the bandgap of the buffer layer is a third bandgap, the third bandgap is larger than the fourth bandgap.

Figure 4:
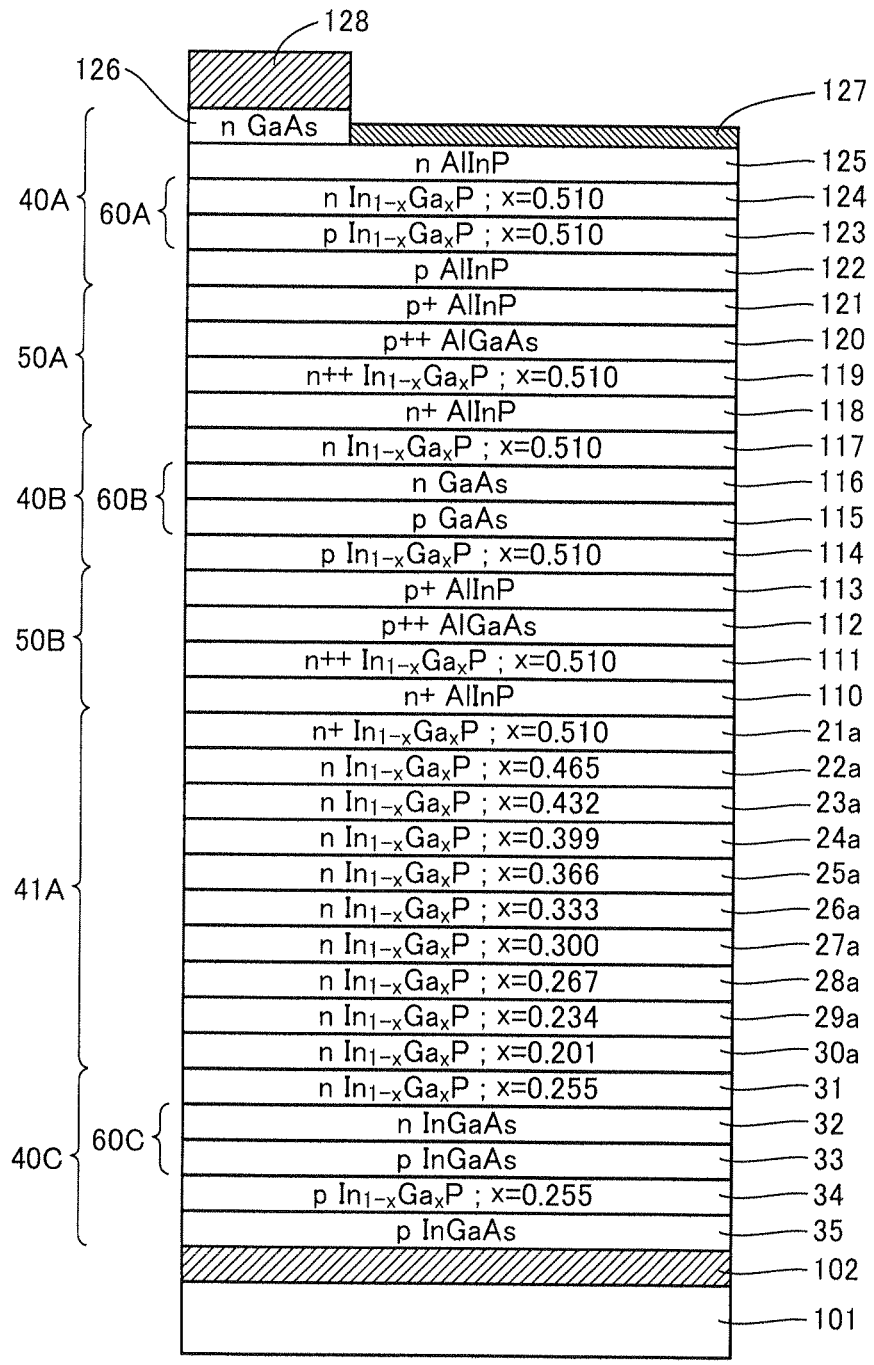
FIG. 4 depicts another exemplary specific cross-sectional structure of the multijunction compound semiconductor solar cell of Example 1.

FIG. 4 exemplarily depicts another specific cross-sectional structure of the multijunction compound semiconductor solar cell of Example 1. The multijunction compound semiconductor solar cell depicted in FIG. 4 has a feature that second electrode 102 is disposed between bottom cell 40C and supporting substrate 101. The other structure is similar to that of the multijunction compound semiconductor solar cell depicted in FIG. 3. Supporting substrate 101 depicted in FIG. 4 may be a semiconductor such as silicon, or alternatively, may be an insulator.

With reference to the cross-sectional structural diagrams of FIGS. 5 and 6, description is given below of an exemplary method of manufacturing the multijunction compound semiconductor solar cell having the structure depicted in FIG. 4. The manufacturing method described hereinafter has a feature that layers are formed on a semiconductor substrate by epitaxial growth in order from a semiconductor layer to be the light receiving surface side of the multijunction compound semiconductor solar cell.

Figure 5:
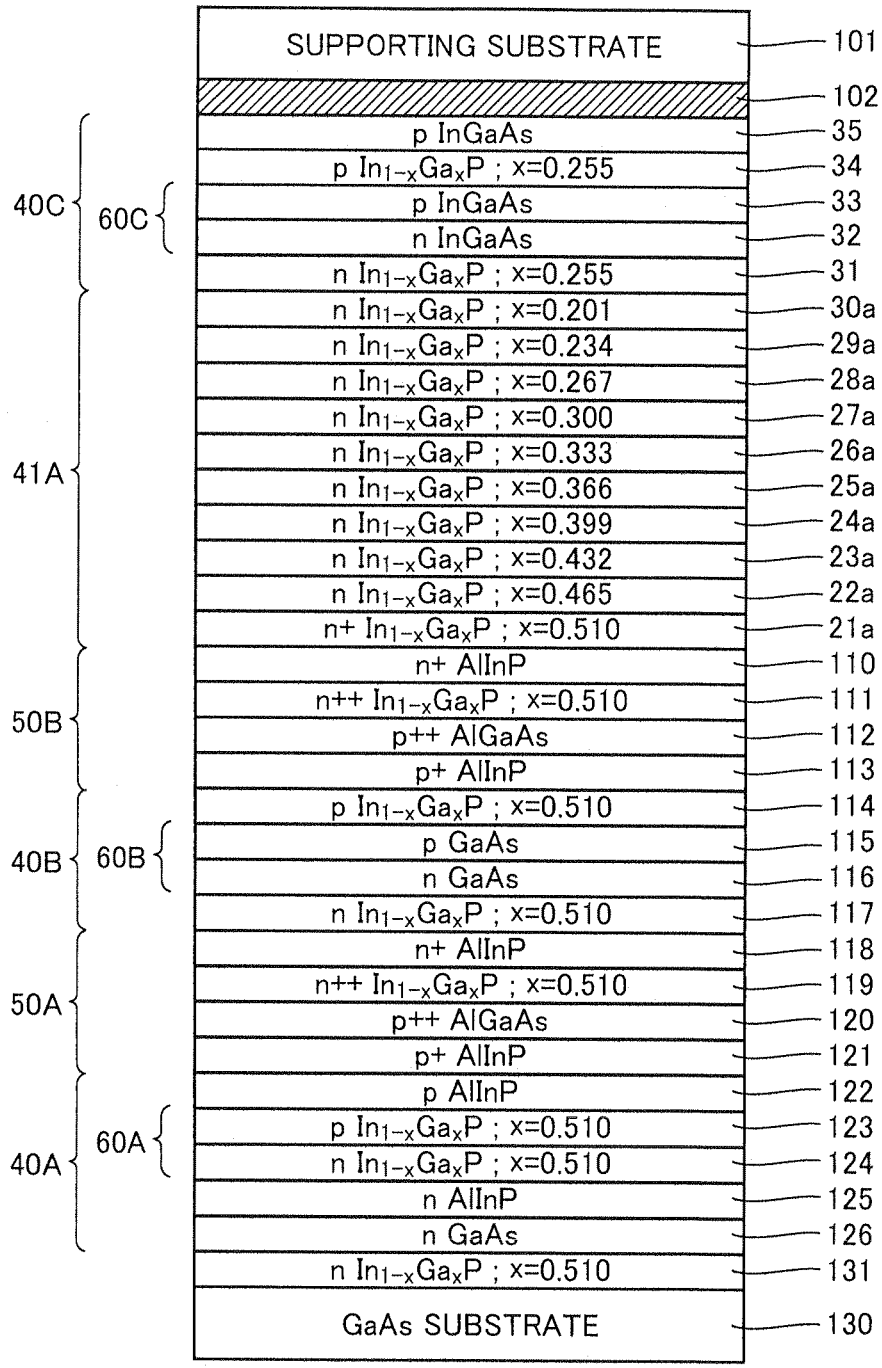
FIG. 5 is an illustrative outline cross-sectional view of a portion of a process of an exemplary method of manufacturing a multijunction compound semiconductor solar cell having the structure depicted in FIG. 4.
Figure 6:
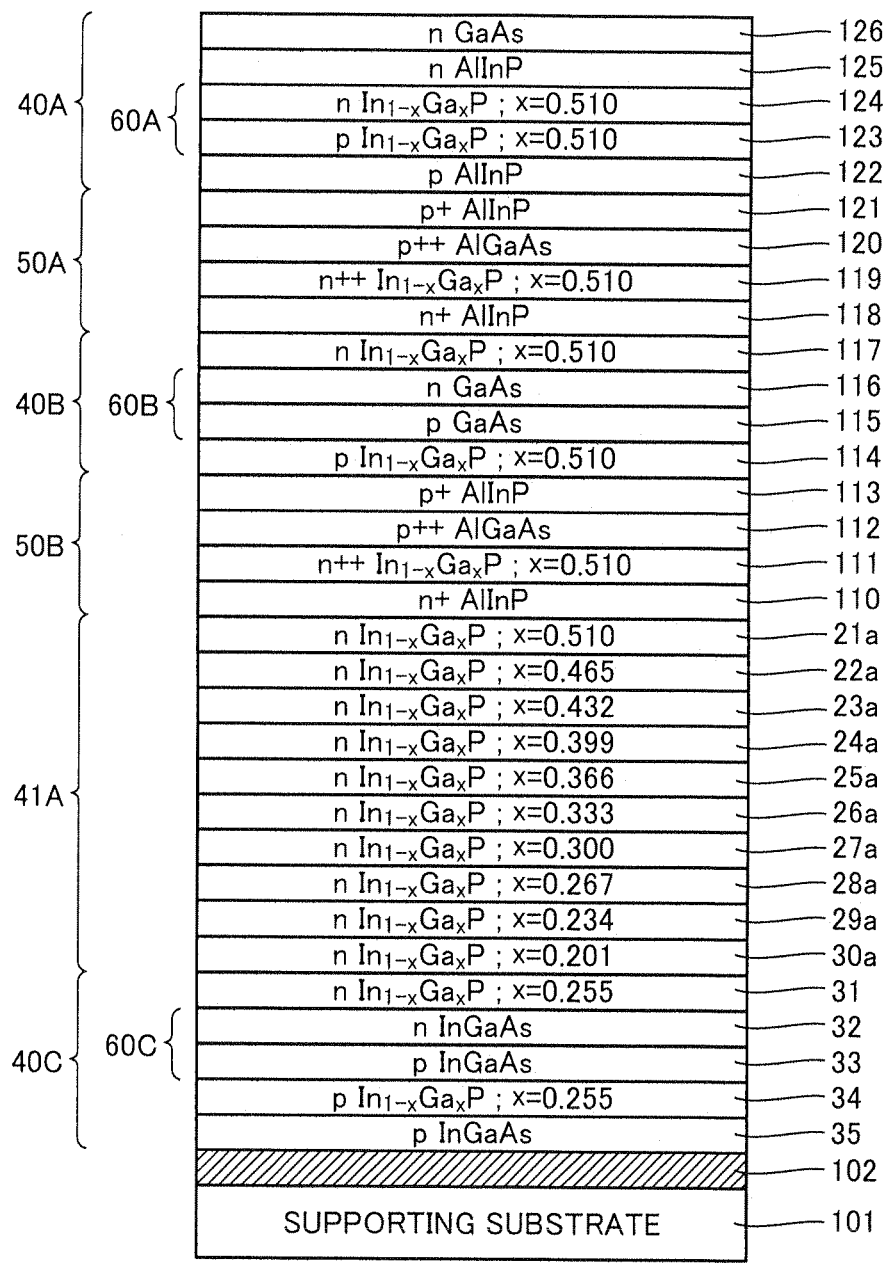
FIG. 6 is an illustrative outline cross-sectional view of another portion of the process of the exemplary method of manufacturing the multijunction compound semiconductor solar cell having the structure depicted in FIG. 4.

First, as depicted in FIG. 5, for example, a GaAs substrate 130 is set in an MOCVD (Metal Organic Chemical Vapor Deposition) apparatus, and an etching stopper layer 131 formed of N type $In_{0.490}Ga_{0.510}P$, which etching stopper layer 131 is to be an etching stopper layer that allows for selective etching with GaAs, contact layer 126 formed of N type GaAs, window layer 125 formed of N type AlInP, emitter layer 124 formed of N type $In_{0.490}Ga_{0.510}P$, base layer 123 formed of P type $In_{0.490}Ga_{0.510}P$, and BSF layer 122 formed of P type AlInP are epitaxially grown in this order by the MOCVD method on GaAs substrate 130.

Next, P+ type AlInP layer 121, P++ type AlGaAs layer 120, N++ type $In_{0.490}Ga_{0.510}P$ layer 119, and N+ type AlInP layer 118 are epitaxially grown on BSF layer 122 formed of P type AlInP in this order by the MOCVD method.

Next, window layer 117 formed of N type $In_{0.490}Ga_{0.510}P$, emitter layer 116 formed of N type GaAs, base layer 115 formed of P type GaAs, and BSF layer 114 formed of P type $In_{0.490}Ga_{0.510}P$ are epitaxially grown on N+ type AlInP layer 118 in this order by the MOCVD method.

Next, P+ type AlInP layer 113, P++ type AlGaAs layer 112, N++ type $In_{0.490}Ga_{0.510}P$ layer 111, and N+ type AlInP layer 110 are epitaxially grown on BSF layer 114 formed of P type $In_{0.490}Ga_{0.510}P$ in this order by the MOCVD method.

Next, N+ type $In_{0.490}Ga_{0.510}P$ layer 21a, N type $In_{0.535}Ga_{0.465}P$ layer 22a, N type $In_{0.568}Ga_{0.432}P$ layer 23a, N type $In_{0.601}Ga_{0.399}P$ layer 24a, N type $In_{0.634}Ga_{0.366}P$ layer 25a, N type $In_{0.667}Ga_{0.333}P$ layer 26a, N type $In_{0.700}Ga_{0.300}P$ layer 27a, N type $In_{0.733}Ga_{0.267}P$ layer 28a, N type $In_{0.766}Ga_{0.234}P$ layer 29a, and N type $In_{0.799}Ga_{0.201}P$ layer 30a are epitaxially grown on N+ type AlInP layer 110 in this order by the MOCVD method. Since the lattice constant of a InGaP layer varies depending on the composition ratio between In and Ga, which are group III elements of the InGaP layer, the layers of buffer layer 41A are epitaxially grown to have lattice constants varied stepwise.

It is to be noted here that, while N type $In_{0.799}Ga_{0.201}P$ layer 30a has a thickness of 1 μm, the other layers (21a to 29a) have a thickness of 0.25 μm.

N+ type $In_{0.490}Ga_{0.510}P$ layer 21a grows epitaxially in such a manner as to have lattice match with the layers below N+ type AlInP layer 110. Herein, the layers from GaAs substrate 130 to N+ type AlInP layer 110 are lattice-matched. Thus, epitaxial growth is achieved such that the lattice constants as from N type $In_{0.535}Ga_{0.465}P$ layer 22a vary stepwise. Herein, in order not to form a buffer layer of InGaP layers with varied lattice constants but to form a buffer layer of InGaP layers with unchanged lattice constants on N+ type AlInP layer 110, an N+ type $In_{0.490}Ga_{0.510}P$ layer 21a was first formed so as to be lattice-matched with N+ type AlInP layer 110.

Inside buffer layer 41A, difference in lattice constant between N+ type $In_{0.490}Ga_{0.510}P$ layer 21a and N type $In_{0.535}Ga_{0.465}P$ layer 22a is larger than the difference in lattice constant between two adjacent layers of the other InGaP layers. Hence, one portion exists inside buffer layer 41A on the middle cell 40B side, in which portion difference in lattice constant between two adjacent semiconductor layers is larger than the difference in lattice constant between two adjacent layers of the other semiconductor layers. Further, difference in lattice constant is the same between two adjacent layers of the other semiconductor layers, other than the difference in lattice constant between N+ type $In_{0.490}Ga_{0.510}P$ layer 21a and N type $In_{0.535}Ga_{0.465}P$ layer 22a.

Next, window layer 31 formed of N type $In_{0.745}Ga_{0.255}P$, emitter layer 32 formed of N type InGaAs, base layer 33 formed of P type InGaAs, BSF layer 34 formed of P type $In_{0.745}Ga_{0.255}P$, and contact layer 35 formed of P type InGaAs are epitaxially grown in this order by the MOCVD method on N type $In_{0.799}Ga_{0.201}P$ layer 30a.

Herein, for window layer 31, a composition of In and Ga, which are group III elements, was selected so as to have lattice match with the InGaAs constituting the photoelectric conversion layer of bottom cell 40C.

It should be noted that $AsH_3$ (arsine) and TMG (trimethyl garium) may be used to form GaAs, and that TMI (trimethyl indium), TMG, and $PH_3$ (phosphine) may be used to form InGaP. Further, TMI, TMG, and $AsH_3$ may be used to form InGaAs, and TMA (trimethyl aluminum), TMI, and $PH_3$ may be used to form AlInP. Moreover, TMA, TMG, and $AsH_3$ may be used to form AlGaAs, and TMA, TMI, TMG, and $AsH_3$ may be used to form AlInGaAs.

Then, as depicted in FIG. 5, second electrode 102 constituted of a laminate of, for example, Au (for example, 0.1 μm in thickness)/Ag (for example, 3 μm in thickness) is formed on the surface of contact layer 35 formed of P type InGaAs, and supporting substrate 101 is then applied to second electrode 102.

Next, GaAs substrate 130 is removed. Herein, the removal of GaAs substrate 130 may be carried out by, for example, as depicted in the outline cross-sectional view of FIG. 6, etching using an alkali solution on GaAs substrate 130, followed by etching using an acidic solution on etching stopper layer 131 formed of N type $In_{0.490}Ga_{0.510}P$.

Subsequently, a resist pattern is formed by photolithography on contact layer 126 formed of N type GaAs, and then contact layer 126 corresponding to the resist pattern is etchingly removed by using an alkali solution. Then, a resist pattern is again formed by photolithography on the remaining portion of the surface of contact layer 126, and first electrode 128 constituted of a laminate of, for example, AuGe (12%) (for example, 0.1 μm in thickness)/Ni (for example, 0.02 μm in thickness)/Au (for example, 0.1 μm in thickness)/Ag (for example, 5 μm in thickness) is formed by using an apparatus such as a resistance heating evaporator or an EB evaporator.

Next, after forming a mesa etching pattern, mesa etching is performed using an alkali solution and an acidic solution. Then, antireflection film 127 of $ZnS/MgF_2$ is formed by, for example, sputtering technique, electron beam evaporation technique, or resistance heating evaporation technique. These processes provide a multijunction compound semiconductor solar cell having the structure depicted in FIG. 4, in which the light receiving surface of the multijunction compound semiconductor solar cell is located on the opposite side in a direction of growth of compound semiconductors.

It was found through measurement of photovoltaic characteristics of the multijunction compound semiconductor solar cell having the structure depicted in FIG. 4 that characteristic values of Eff=35.5%, Voc=2.98 V, Jsc=14.0 mA/cm$^2$, and FF=0.850 were obtained, and that reproducible characteristics were attained. Further, current matching was seen among the cells (top cell 40A, middle cell 40B, and bottom cell 40C) in the fabricated film thickness.

It is considered that the above characteristics of the multijunction compound semiconductor solar cell were achieved because the crystallinity of bottom cell 40C was improved for the following reasons: N type $In_{0.799}Ga_{0.201}P$ layer 30a of buffer layer 41A, which layer is closest to the bottom cell 40C side, is larger in lattice constant than photoelectric conversion layer 60C of bottom cell 40C; further, of the semiconductor layers of buffer layer 41A that have lattice constants varied stepwise, two adjacent semiconductor layers have a larger difference in lattice constant than the other two adjacent semiconductor layers, and such a portion exists at the closest position to middle cell 40B.

It is considered that improvement in crystallinity of bottom cell 40C resulted in improvement in characteristic of bottom cell 40C, hence improvement in photovoltaic characteristic of the multijunction compound semiconductor solar cell.

It is considered that the crystallinity of bottom cell 40C was improved because, in the case where a value greater than or equal to a certain value is set for the difference in lattice constant between two adjacent layers of buffer layer 41A within which a plurality of semiconductor layers exists, crystal growth that has transited from two-dimensional growth to three-dimensional growth has slightly taken place, in addition to the phenomenon of occurrence of dislocation, in N type $In_{0.535}Ga_{0.465}P$ layer 22a, and this slightly prompted three-dimensional growth reduces distortion in N type $In_{0.535}Ga_{0.465}P$ layer 22a, which improves the crystallinity of N type $In_{0.535}Ga_{0.465}P$ layer 22a.

Bringing about this reduction in distortion at a portion closest to the middle cell 40B side in buffer layer 41A allows for formation of semiconductor layers with better crystallinity, and stacking semiconductor layers on the semiconductor layers with better crystallinity allows for improvement in crystallinity of bottom cell 40C.

Figure 16:
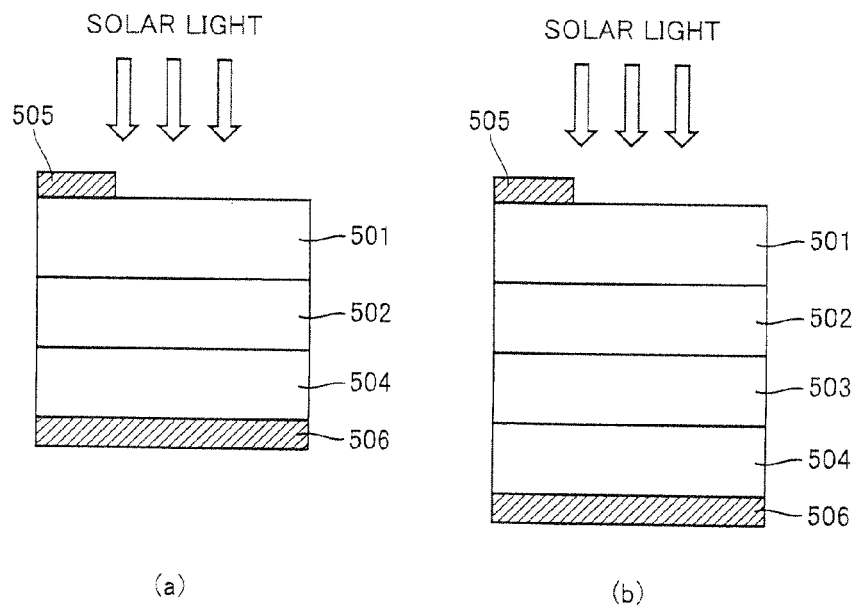
FIGS. 16(a) and 16(b) are outline cross-sectional views of a multijunction compound semiconductor solar cell of related art.
Figure 17:
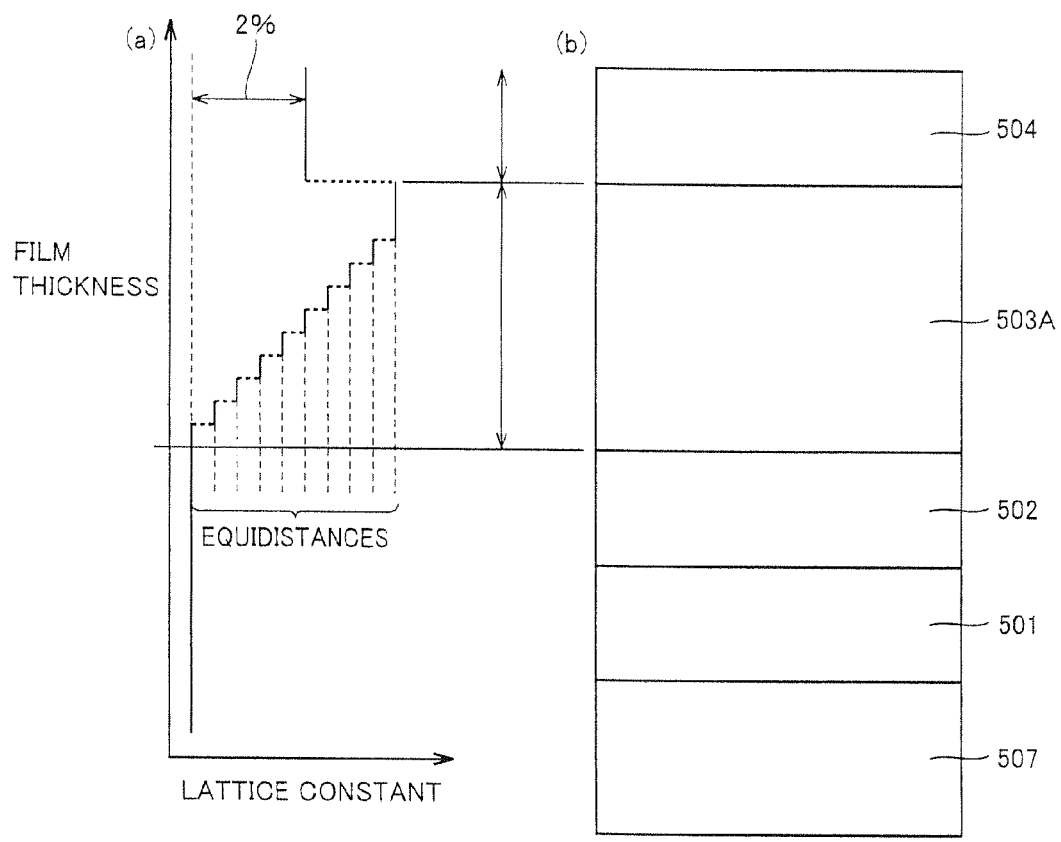
FIG. 17(a) depicts a relationship between the lattice constant and the film thickness of a multijunction compound semiconductor solar cell wafer of the related art that is depicted in FIG. 17(b), where
FIG. 17(b) is an outline cross-sectional view of the multijunction compound semiconductor solar cell wafer of the related art.

It is to be noted that the characteristic values are Eff=33.78%, Voc=2.96 V, Jsc=13.14 mA/cm$^2$, and FF=0.850 with respect to the structure with the lattice constants of the semiconductor layers in the buffer layer that is described in Non-patent Document 1 (corresponding to reference numeral 503 in FIG. 16(b), reference numeral 503A in FIG. 17(b), and reference numeral 503B in FIG. 18(b)) varied at specific widths.

In Example 1, N+ type $In_{0.490}Ga_{0.510}P$ layer 21a of buffer layer 41A is different in Ga composition x by 0.045 from N type $In_{0.535}Ga_{0.465}P$ layer 22a, and difference in Ga composition x is 0.033 between each two layers of the other InGaP layers.

Herein, if difference in Ga composition x is excessively large between N+ type $In_{0.490}Ga_{0.510}P$ layer 21a and N type $In_{0.535}Ga_{0.465}P$ layer 22a of buffer layer 41A, the dislocation density in N type $In_{0.535}Ga_{0.465}P$ layer 22a grows, which invites degradation of crystallinity because the layers from N type $In_{0.568}Ga_{0.432}P$ layer 23a to N type $In_{0.799}Ga_{0.201}P$ layer 30a of buffer layer 41A and the layers in bottom cell 40C retain that dislocation density. Further, if difference in Ga composition x is excessively small between N+ type $In_{0.490}Ga_{0.510}P$ layer 21a and N type $In_{0.535}Ga_{0.465}P$ layer 22a of buffer layer 41A, nuclei of the three-dimensional growth that acts to improve the crystallinity of N type $In_{0.535}Ga_{0.465}P$ layer 22a hardly appear in N type $In_{0.535}Ga_{0.465}P$ layer 22a.

Figure 7:
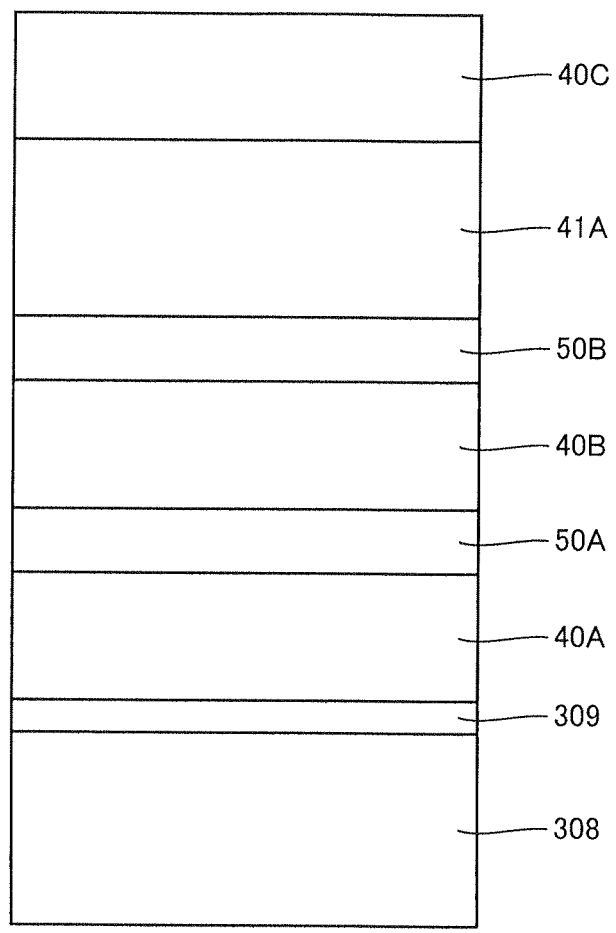
FIG. 7 is a conceptual diagram of a method of manufacturing the multijunction compound semiconductor solar cell of Example 1.

FIG. 7 depicts a conceptual diagram of a method of manufacturing the multijunction compound semiconductor solar cell of Example 1. Specifically, according to the manufacturing method, an etching stopper layer 309, top cell 40A, first tunnel junction layer 50A, middle cell 40B, second tunnel junction layer 50B, buffer layer 41A, and bottom cell 40C are formed in this order on a semiconductor substrate 308, and semiconductor substrate 308 is removed by etching.

Figure 8:
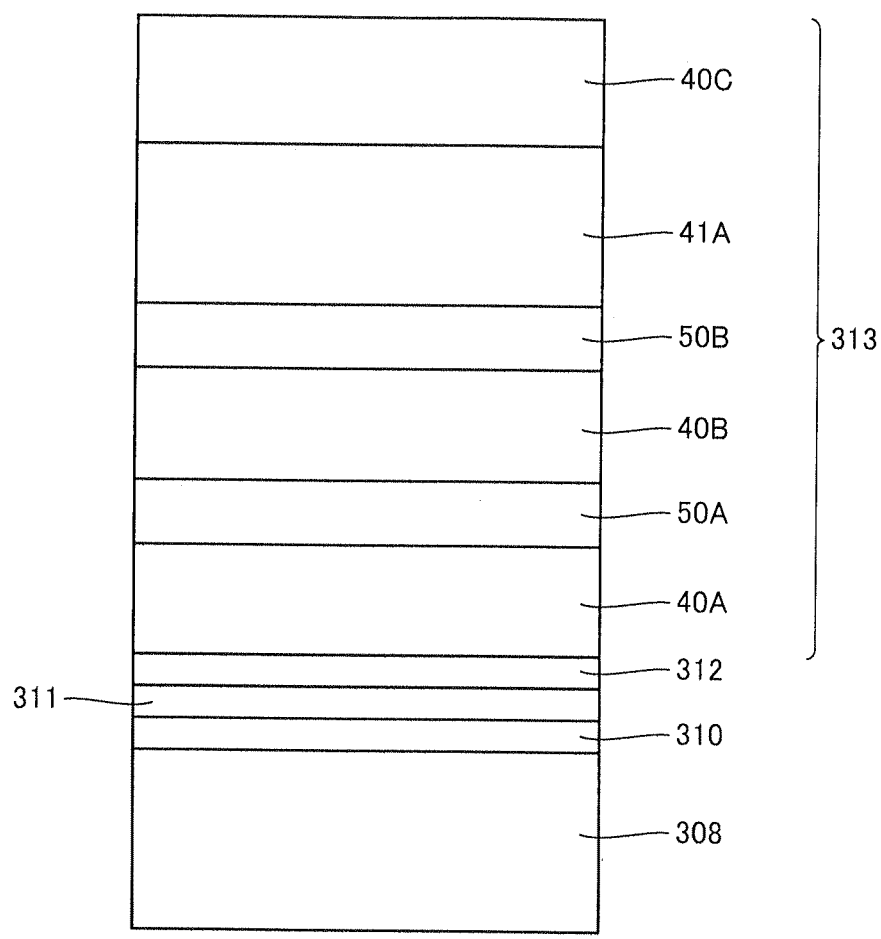
FIG. 8 is another exemplary conceptual diagram of the method of manufacturing the multijunction compound semiconductor solar cell of Example 1.

FIG. 8 depicts another exemplary conceptual diagram of the method of manufacturing the multijunction compound semiconductor solar cell of Example 1. The example depicted in FIG. 8 has a feature that an attempt is made to reuse the semiconductor substrate. An etching stopper layer 310, an etching layer 311, and an etching stopper layer 312 are stacked on semiconductor substrate 308, and etching is then performed on etching layer 311, thus allowing the semiconductor substrate 308 side to be separated from the multijunction cell 313 side. In this manner, reuse of semiconductor substrate 308 becomes possible.

Specifically, in the case where a GaAs substrate is to be reused for semiconductor substrate 308, an N type $In_{0.490}Ga_{0.510}P$ layer serving as etching stopper layer 310, an AlAs layer serving as etching layer 311, and an N type $In_{0.490}Ga_{0.510}P$ layer serving as etching stopper layer 312 are epitaxially grown in this order on the GaAs substrate by the MOCVD method. Multijunction cell 313 is formed on etching stopper layer 312. The above-described layers are formed in multijunction cell 313. Multijunction cell 313 is not limited to the above-described layers. The AlAs layer may be treated with etching by hydrofluoric acid so as to separate the multijunction cell 313 side from the GaAs substrate side.

The N type $In_{0.490}Ga_{0.510}P$ layer serving as etching stopper layer 312 on the multijunction cell 313 side and the N type $In_{0.490}Ga_{0.510}P$ layer serving as etching stopper layer 310 on the GaAs substrate side after the separation are removable through etching by using an acidic solution other than hydrofluoric acid. Hence, a solar cell is manufactured on the multijunction cell 313 side, which allows for reuse of the GaAs substrate.

Examples 2 and 3 and Comparative Examples 1 and 2

Next, in a condition where difference in Ga composition x was set to 0.045 between two layers of an N+ type $In_{0.490}Ga_{0.510}P$ layer and an N type $In_{0.535}Ga_{0.465}P$ layer that are adjacent each other in the buffer layer at a position closest to the middle cell, study was conducted with difference in Ga composition x altered between two layers of the other InGaP layers. Description is given below of Examples 2 and 3 that exhibited favorable photovoltaic characteristics and of the other Comparative Examples 1 and 2.

Further, multijunction compound semiconductor solar cells were fabricated such that the composition of group III elements of the buffer layers was changed so as to vary the lattice constants in the buffer layers. The multijunction compound semiconductor solar cells of Examples 2 and 3 and Comparative Examples 1 and 2 were fabricated in the same manner as Example 1, except that these solar cells involve different structures and manufacturing methods with respect to the buffer layers. The buffer layers were fabricated through epitaxial growth by the MOCVD method as in Example 1. Further, the buffer layers comprise a plurality of semiconductor layers with lattice constants varied through change in composition of group III elements, as in Example 1.

Example 2

Figure 9:
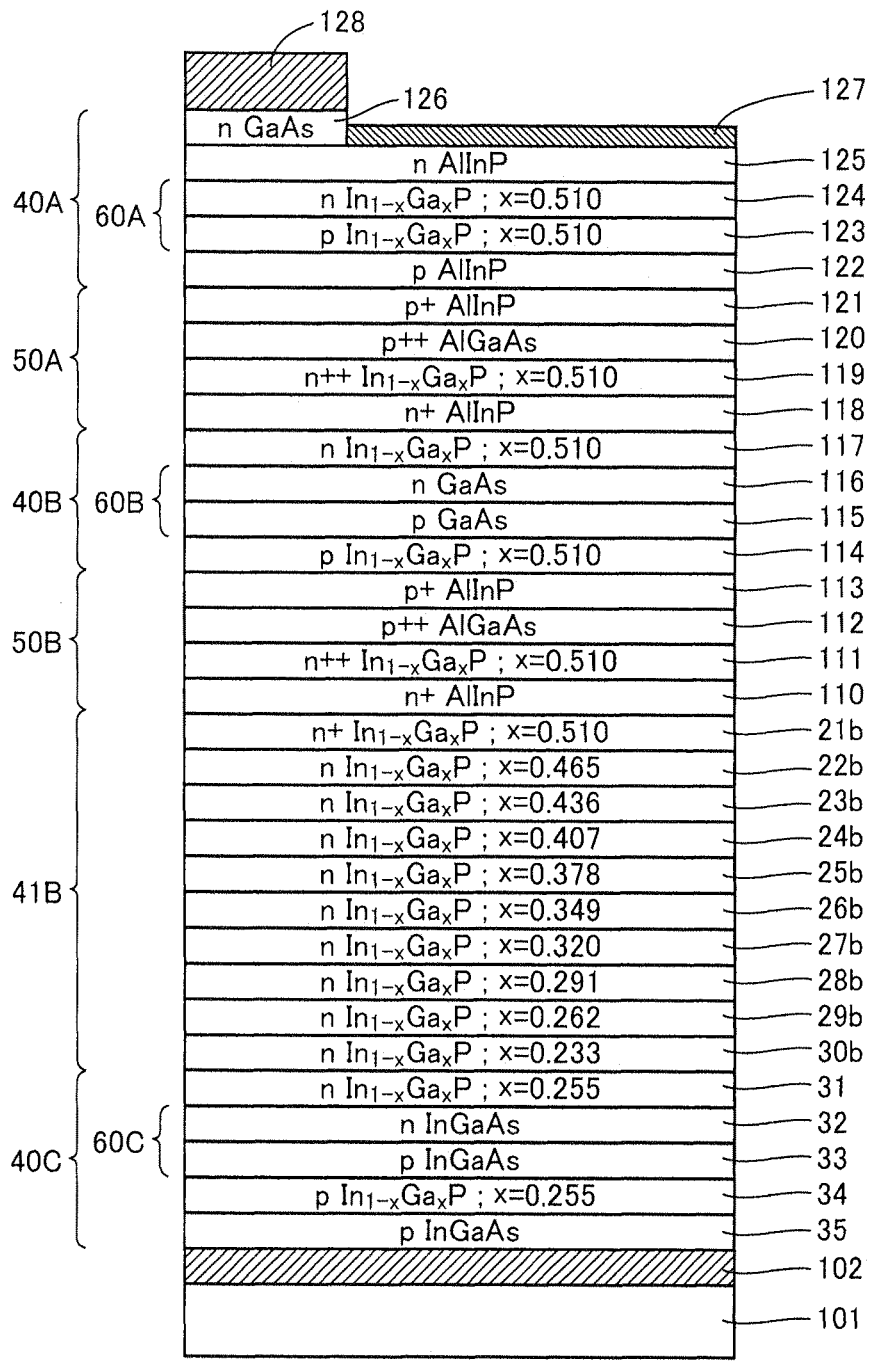
FIG. 9 depicts a specific cross-sectional structure of a multijunction compound semiconductor solar cell of Example 2.

FIG. 9 depicts a specific cross-sectional structure of the multijunction compound semiconductor solar cell of Example 2. The multijunction compound semiconductor solar cell of Example 2 depicted in FIG. 9 has a difference in Ga composition x of 0.045 between an N+ type $In_{0.490}Ga_{0.510}P$ layer 21b and an N type $In_{0.535}Ga_{0.465}P$ layer 22b of a buffer layer 41B, and a difference in Ga composition x of 0.029 between two layers of the other InGaP layers.

Buffer layer 41B has a structure in which an N type $In_{0.767}Ga_{0.233}P$ layer 30b (for example, 1 μm in thickness), an N type $In_{0.738}Ga_{0.262}P$ layer 29b (for example, 0.25 μm in thickness), an N type $In_{0.709}Ga_{0.291}P$ layer 28b (for example, 0.25 μm in thickness), an N type $In_{0.680}Ga_{0.320}P$ layer 27b (for example, 0.25 μm in thickness), an N type $In_{0.651}Ga_{0.349}P$ layer 26b (for example, 0.25 μm in thickness), an N type $In_{0.622}Ga_{0.378}P$ layer 25b (for example, 0.25 μm in thickness), an N type $In_{0.593}Ga_{0.407}P$ layer 24b (for example, 0.25 μm in thickness), an N type $In_{0.564}Ga_{0.436}P$ layer 23b (for example, 0.25 μm in thickness), N type $In_{0.535}Ga_{0.465}P$ layer 22b (for example, 0.25 μm in thickness), and N+ type $In_{0.490}Ga_{0.510}P$ layer 21b (for example, 0.25 μm in thickness) are stacked in this order on bottom cell 40C.

While merely buffer layer 41B is described above, the structure excluding buffer layer 41B is the same as that of Example 1.

Example 3

Figure 10:
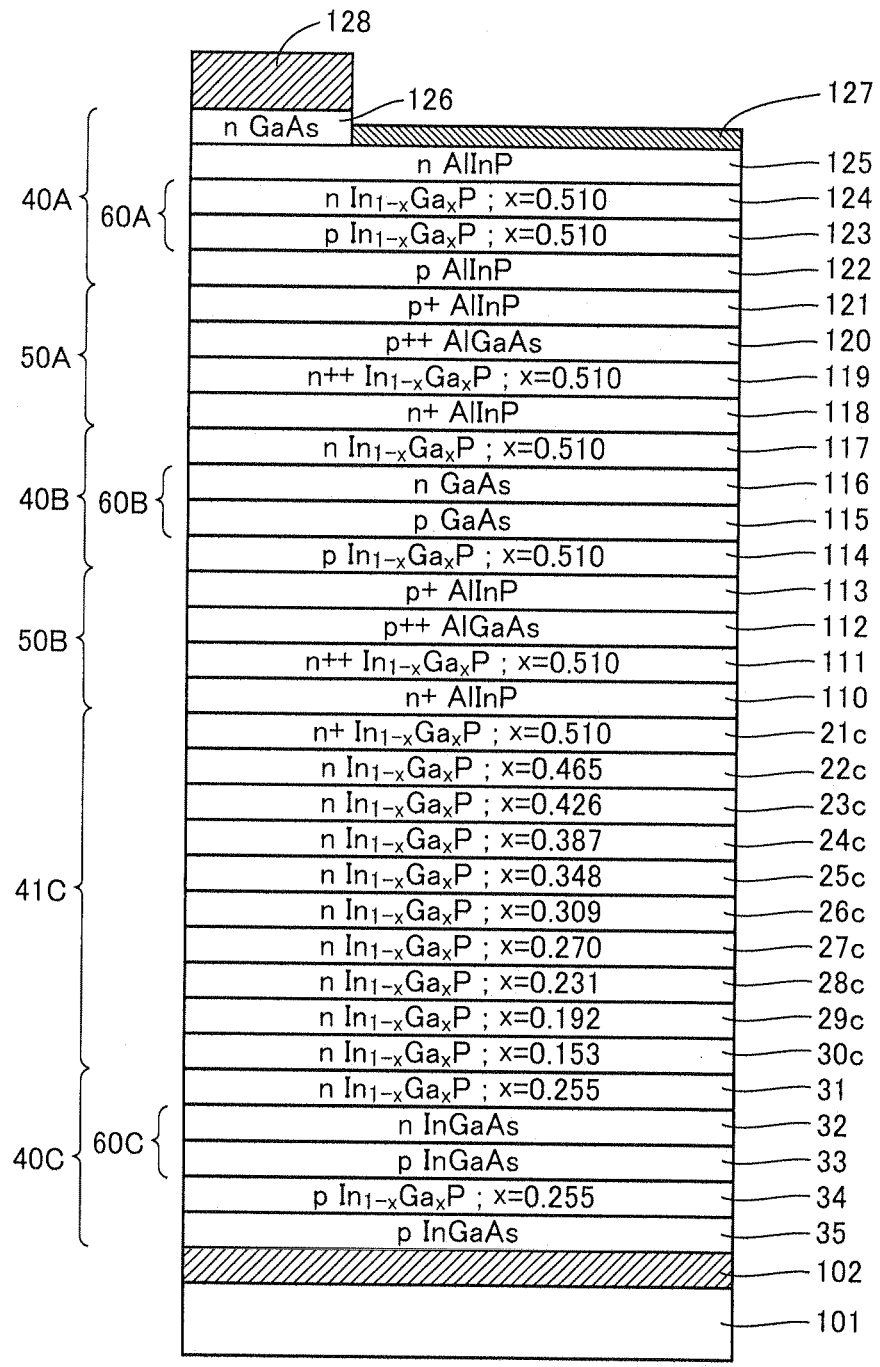
FIG. 10 depicts a specific cross-sectional structure of a multijunction compound semiconductor solar cell of Example 3.

FIG. 10 depicts a specific cross-sectional structure of the multijunction compound semiconductor solar cell of Example 3. The multijunction compound semiconductor solar cell of Example 3 has the same structure as that of Example 2 except the structure of a buffer layer 41C and was fabricated by the same method as Example 2.

Difference in Ga composition x is 0.045 between an N+ type $In_{0.490}Ga_{0.510}P$ layer 21c and an N type $In_{0.535}Ga_{0.465}P$ layer 22c of buffer layer 41C, and difference in Ga composition x is 0.039 between two layers of the other InGaP layers.

Buffer layer 41C has a structure in which an N type $In_{0.847}Ga_{0.153}P$ layer 30c (for example, 1 μm in thickness), an N type $In_{0.808}Ga_{0.192}P$ layer 29c (for example, 0.25 μm in thickness), an N type $In_{0.769}Ga_{0.231}P$ layer 28c (for example, 0.25 μm in thickness), an N type $In_{0.730}Ga_{0.270}P$ layer 27c (for example, 0.25 μm in thickness), an N type $In_{0.691}Ga_{0.309}P$ layer 26c (for example, 0.25 μm in thickness), an N type $In_{0.652}Ga_{0.348}P$ layer 25c (for example, 0.25 μm in thickness), an N type $In_{0.613}Ga_{0.387}P$ layer 24c (for example, 0.25 μm in thickness), an N type $In_{0.574}Ga_{0.426}P$ layer 23c (for example, 0.25 μm in thickness), N type $In_{0.535}Ga_{0.465}P$ layer 22c (for example, 0.25 μm in thickness), and N+ type $In_{0.490}Ga_{0.510}P$ layer 21c (for example, 0.25 μm in thickness) are stacked in this order on bottom cell 40C.

Comparative Example 1

The multijunction compound semiconductor solar cell of Comparative Example 1 has the same structure as that of Example 1 other than the structure of the buffer layer and was fabricated by the same method as Example 1. It is to be noted that the buffer layer of the multijunction compound semiconductor solar cell of Comparative Example 1 has an identical thickness to the thickness of buffer layer 41A of Example 1.

In the buffer layer of the multijunction compound semiconductor solar cell of Comparative Example 1, difference in Ga composition x was set to 0.045 between the two adjacent layers of an N+ type $In_{0.490}Ga_{0.510}P$ layer and an N type $In_{0.535}Ga_{0.465}P$ layer that are disposed at a position closest to the middle cell, and difference in Ga composition x was set to 0.028 between two adjacent layers of the other InGaP layers.

Comparative Example 2

The multijunction compound semiconductor solar cell of Comparative Example 2 also has the same structure as that of Example 1 other than the structure of the buffer layer and was fabricated by the same method as Example 1. It is to be noted that the buffer layer of the multijunction compound semiconductor solar cell of Comparative Example 1 has an identical thickness to the thickness of buffer layer 41A of Example 1.

In the buffer layer of the multijunction compound semiconductor solar cell of Comparative Example 2, difference in Ga composition x was set to 0.045 between the two adjacent layers of an N+ type $In_{0.490}Ga_{0.510}P$ layer and an N type $In_{0.535}Ga_{0.465}P$ layer that are disposed at a position closest to the middle cell, and difference in Ga composition x was set to 0.041 between two adjacent layers of the other InGaP layers.

Examples 4 and 5 and Comparative Examples 3 and 4

Next, study was conducted with difference in Ga composition x altered between two layers of an N+ type $In_{0.490}Ga_{0.510}P$ layer and an N type InGaP layer that are adjacent each other in the buffer layer at a portion closest to the middle cell, and that difference in Ga composition x was set to 0.033 between two layers of the other InGaP layers. Description is given below of Examples 4 and 5 that exhibited favorable photovoltaic characteristics and of the other Comparative Examples 3 and 4.

Further, as in Examples 2 and 3, multijunction compound semiconductor solar cells were fabricated such that the composition of group III elements of the buffer layers was changed so as to vary the lattice constants in the buffer layers. The multijunction compound semiconductor solar cells of Examples 4 and 5 and Comparative Examples 3 and 4 were fabricated in the same manner as Example 1 except for the structures and manufacturing methods of the buffer layers. The buffer layers were fabricated through epitaxial growth by the MOCVD method as in Example 1. Further, the buffer layers comprise, as in Example 1, a plurality of semiconductor layers in which the lattice constants were varied by changing the composition of group III elements.

Example 4

Figure 11:
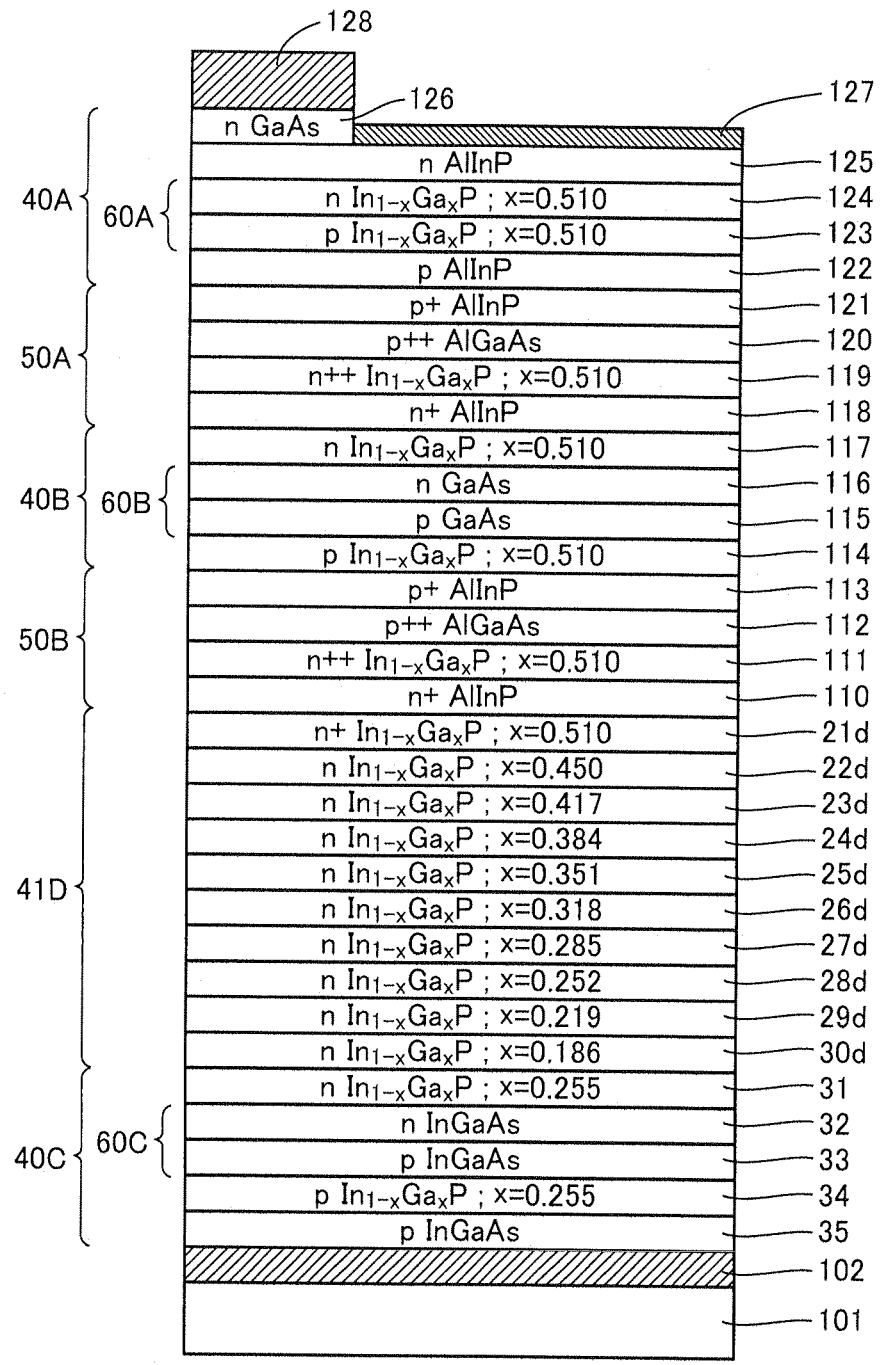
FIG. 11 depicts a specific cross-sectional structure of a multijunction compound semiconductor solar cell of Example 4.

FIG. 11 depicts a specific cross-sectional structure of the multijunction compound semiconductor solar cell of Example 4. The multijunction compound semiconductor solar cell of Example 4 has the same structure as that of Example 1 other than the structure of a buffer layer 41D and was fabricated by the same method as Example 1.

Difference in Ga composition x is 0.060 between an N+ type $In_{0.490}Ga_{0.510}P$ layer 21d and an N type $In_{0.550}Ga_{0.450}P$ layer 22d of buffer layer 41D, and difference in Ga composition x is 0.033 between two layers of the other InGaP layers.

Buffer layer 41D has a structure in which an N type $In_{0.814}Ga_{0.186}P$ layer 30d (for example, 1 μm in thickness), an N type $In_{0.781}Ga_{0.219}P$ layer 29d (for example, 0.25 μm in thickness), an N type $In_{0.748}Ga_{0.252}P$ layer 28d (for example, 0.25 μm in thickness), an N type $In_{0.715}Ga_{0.285}P$ layer 27d (for example, 0.25 μm in thickness), an N type $In_{0.682}Ga_{0.318}P$ layer 26d (for example, 0.25 μm in thickness), an N type $In_{0.649}Ga_{0.351}P$ layer 25d (for example, 0.25 μm in thickness), an N type $In_{0.616}Ga_{0.384}P$ layer 24d (for example, 0.25 μm in thickness), an N type $In_{0.583}Ga_{0.417}P$ layer 23d (for example, 0.25 μm in thickness), N type $In_{0.550}Ga_{0.450}P$ layer 22d (for example, 0.25 μm in thickness), and N+ type $In_{0.490}Ga_{0.510}P$ layer 21d (for example, 0.25 μm in thickness) are stacked in this order on bottom cell 40C.

Example 5

Figure 12:
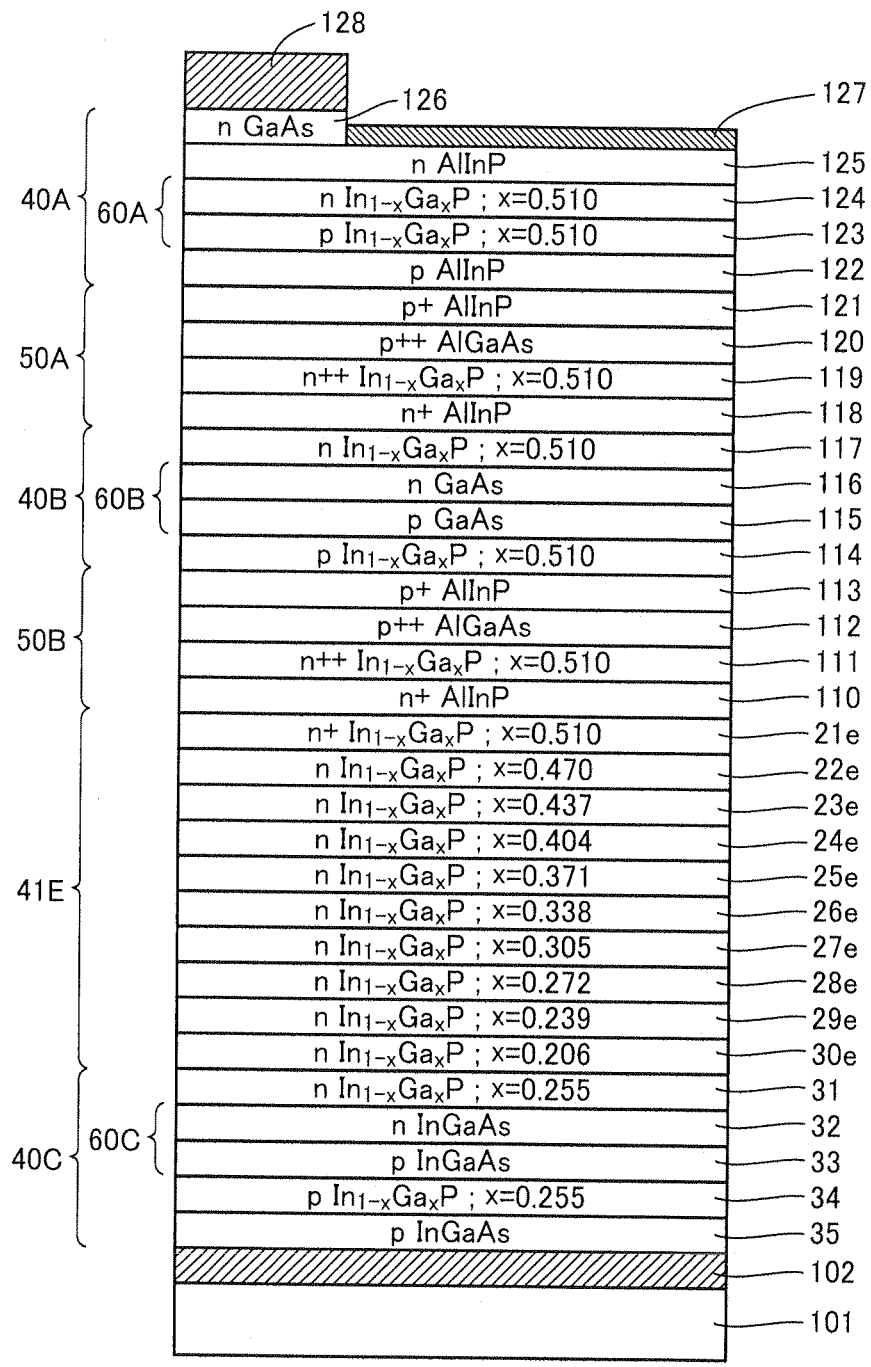
FIG. 12 depicts a specific cross-sectional structure of a multijunction compound semiconductor solar cell of Example 5.

FIG. 12 depicts a specific cross-sectional structure of the multijunction compound semiconductor solar cell of Example 5. The multijunction compound semiconductor solar cell of Example 5 has the same structure as that of Example 1 other than the structure of a buffer layer 41E and was fabricated by the same method as Example 1.

Difference in Ga composition x is 0.040 between an N+ type $In_{0.490}Ga_{0.510}P$ layer 21e and an N type $In_{0.530}Ga_{0.470}P$ layer 22e of buffer layer 41E, and difference in Ga composition x is 0.033 between two layers of the other InGaP layers.

Buffer layer 41E has a structure in which an N type $In_{0.794}Ga_{0.206}P$ layer 30e (for example, 1 μm in thickness), an N type $In_{0.761}Ga_{0.239}P$ layer 29e (for example, 0.25 μm in thickness), an N type $In_{0.728}Ga_{0.272}P$ layer 28e (for example, 0.25 μm in thickness), an N type $In_{0.695}Ga_{0.305}P$ layer 27e (for example, 0.25 μm in thickness), an N type $In_{0.662}Ga_{0.338}P$ layer 26e (for example, 0.25 μm in thickness), an N type $In_{0.629}Ga_{0.371}P$ layer 25e (for example, 0.25 μm in thickness), an N type $In_{0.596}Ga_{0.404}P$ layer 24e (for example, 0.25 μm in thickness), an N type $In_{0.563}Ga_{0.437}P$ layer 23e (for example, 0.25 μm in thickness), N type $In_{0.530}Ga_{0.470}P$ layer 22e (for example, 0.25 μm in thickness), and N+ type $In_{0.490}Ga_{0.510}P$ layer 21e (for example, 0.25 μm in thickness) are stacked in this order on bottom cell 40C.

Comparative Example 3

The multijunction compound semiconductor solar cell of Comparative Example 3 has the same structure as that of Example 1 other than the structure of the buffer layer and was fabricated by the same method as Example 1. It is to be noted that the buffer layer of the multijunction compound semiconductor solar cell of Comparative Example 3 has an identical thickness to the thickness of buffer layer 41A of Example 1.

In the buffer layer of the multijunction compound semiconductor solar cell of Comparative Example 3, difference in Ga composition x was set to 0.033 between the two adjacent layers of an N+ type $In_{0.490}Ga_{0.510}P$ layer and an N type $In_{0.523}Ga_{0.477}P$ layer that are disposed at a position closest to the middle cell, and difference in Ga composition x was set to 0.033 between two adjacent layers of the other InGaP layers.

Comparative Example 4

The multijunction compound semiconductor solar cell of Comparative Example 4 also has the same structure as that of Example 1 other than the structure of the buffer layer and was fabricated by the same method as Example 1. It is to be noted that the buffer layer of the multijunction compound semiconductor solar cell of Comparative Example 4 has an identical thickness to the thickness of buffer layer 41A of Example 1.

In the buffer layer of the multijunction compound semiconductor solar cell of Comparative Example 4, difference in Ga composition x was set to 0.065 between the two adjacent layers of an N+ type $In_{0.490}Ga_{0.510}P$ layer and an N type $In_{0.535}Ga_{0.465}P$ layer that are disposed at a position closest to the middle cell, and difference in Ga composition x was set to 0.033 between two adjacent layers of the other InGaP layers.

The multijunction compound semiconductor solar cells of Examples 2 to 5 may each have a structure in which, like FIG. 3, metal layer 151 is disposed between bottom cell 40C and supporting substrate 101, and in which second electrode 102 is disposed on the back surface side of supporting substrate 101.

<Evaluation>

Next, evaluation was conducted with respect to the multijunction compound semiconductor solar cells of Examples 1 to 5 and of Comparative Examples 1 to 4. The multijunction compound semiconductor solar cells of Examples 1 to 5 and Comparative Examples 1 to 4 are fabricated by the invert fabrication process, and referring to FIG. 2, lattice match is achieved between the GaAs substrates up to first cells 301. The characteristics of the multijunction compound semiconductor solar cells are greatly affected by semiconductor layer 314 comprising second cell 302 and buffer layer 303, wherein second cell 302 is different in lattice constant from first cell 301, and buffer layer 303 has lattice constants varied therein. Thus, semiconductor layer 314 comprising second cell 302 and buffer layer 303 was subjected to characteristic evaluation. Further, cross-sectional observation was conducted on semiconductor layer 314 by using cross-section TEM (Transmission Electron Microscope) images, and especially, cross-sectional observation was conducted on second cell 302.

Figure 13:
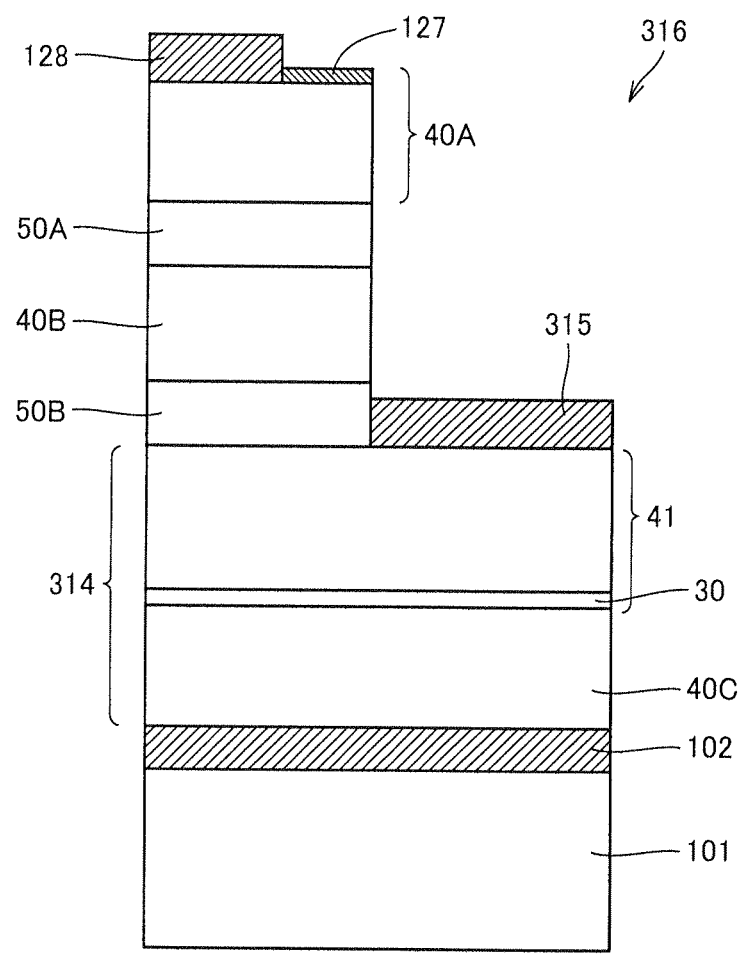
FIG. 13 is a schematic cross-sectional view of an evaluation sample for multijunction compound semiconductor solar cells.
Figure 14:
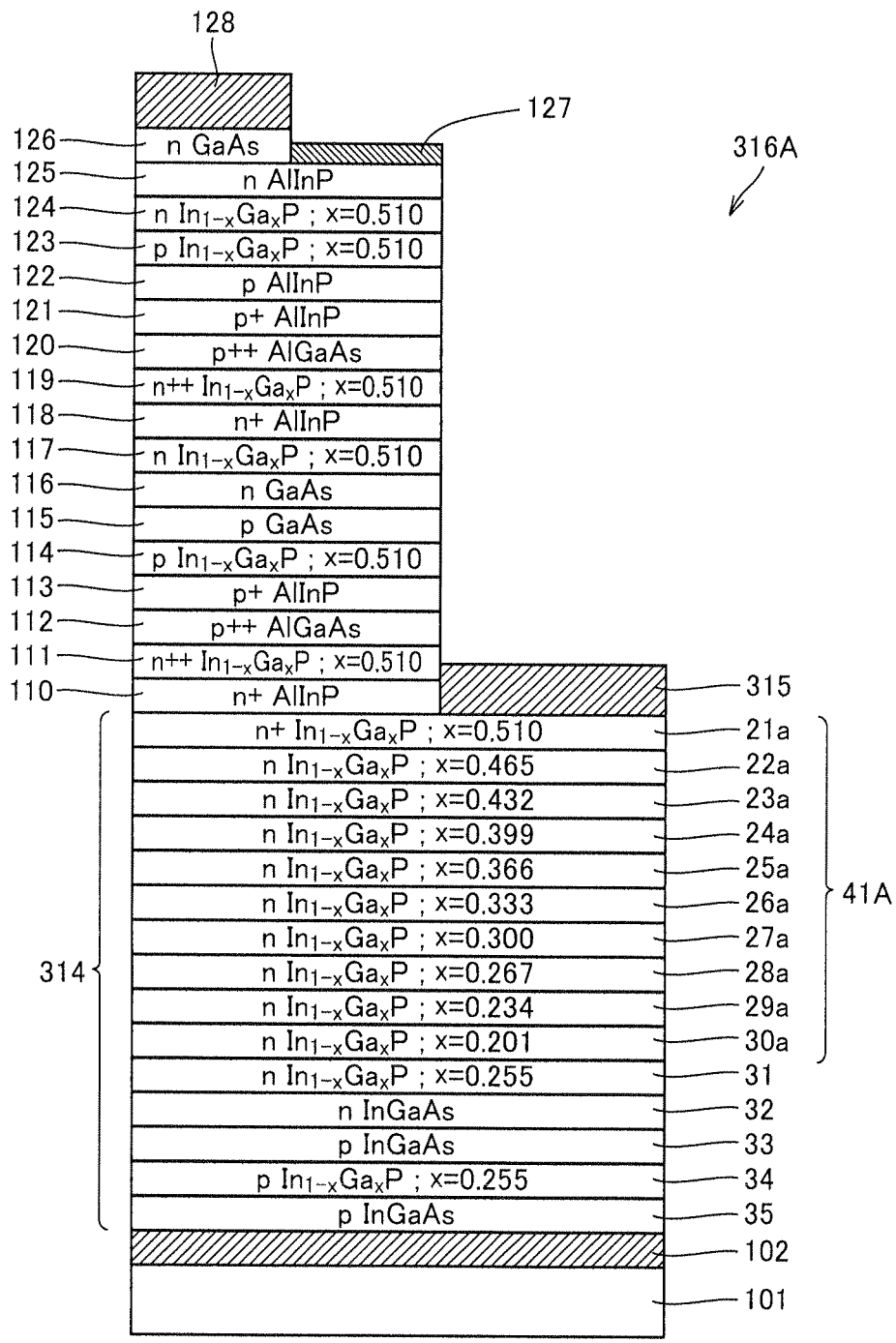
FIG. 14 depicts a specific cross-sectional structure of Evaluation Sample No. 1 corresponding to the multijunction compound semiconductor solar cell of Example 1.

FIG. 13 depicts a schematic cross-sectional view of an evaluation sample for the multijunction compound semiconductor solar cells. As depicted in FIG. 13, the evaluation sample was fabricated by removing a portion of top cell 40A to second tunnel junction layer 50B by means of etching, so as to form an electrode layer 315 for characteristic evaluation. A semiconductor layer 30 of FIG. 13 is an N type InGaP layer in a buffer layer 41 on the side closest to bottom cell 40C. Fabricated as the evaluation sample was Evaluation Samples Nos. 1 to 5 corresponding to the multijunction compound semiconductor solar cells of Examples 1 to 5 and Evaluation Samples Nos. 6 to 9 corresponding to the multijunction compound semiconductor solar cells of Comparative Examples 1 to 4. FIG. 14 exemplarily depicts a specific cross-sectional structure of Evaluation Sample No. 1 (316A) corresponding to the multijunction compound semiconductor solar cell of Example 1 depicted in FIG. 4.

The characteristic evaluation on Evaluation Samples Nos. 1 to 9 was carried out by measurement of Voc (open circuit voltage; in the unit of V) of semiconductor layer 314 by using second electrode 102 and electrode layer 315 of the evaluation sample that are depicted in FIG. 13. The result is shown in Table 1.

Figure 15:
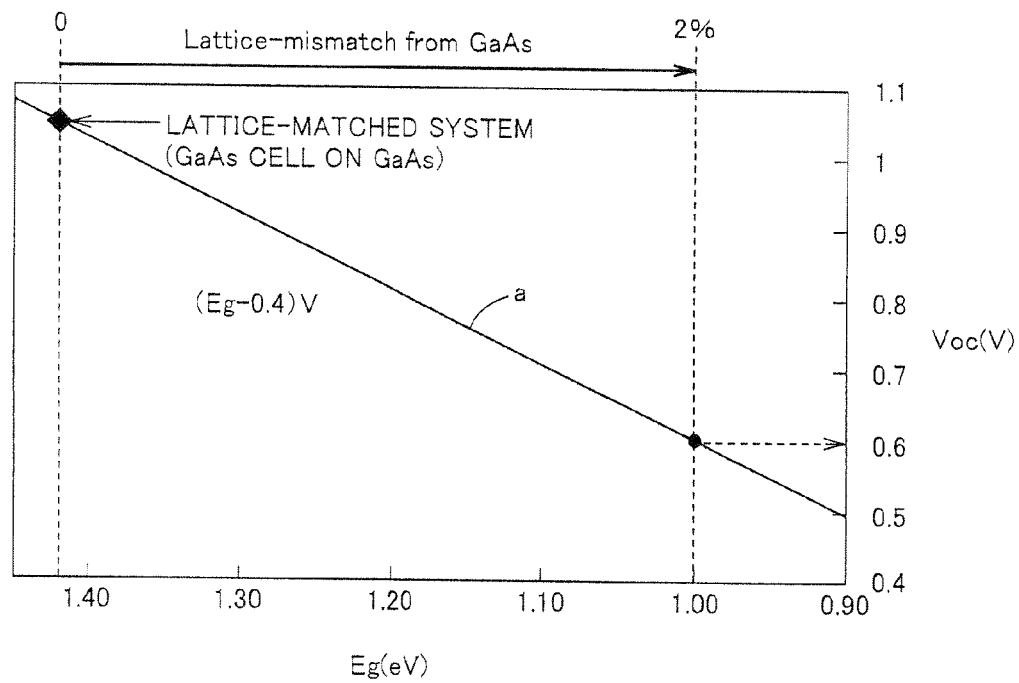
FIG. 15 depicts a relationship between Eg of a photoelectric conversion layer of a bottom cell and Voc of the bottom cell.

FIG. 15 depicts a relationship between Eg (bandgap energy; in the unit of eV) of the photoelectric conversion layer in bottom cell 40C and Voc of bottom cell 40C. The horizontal axis of FIG. 15 indicates Eg (eV) and the vertical axis indicates Voc. The straight line a: Voc=Eg−0.4 having a gradient in FIG. 15 indicates the relationship between Eg and Voc on the assumption that the best crystallinity is attained.

The multijunction compound semiconductor solar cell has the highest photoelectric conversion efficiency when the bandgap energy Eg of the photoelectric conversion layer in bottom cell 40C is set as Eg=1.0 eV; therefore, as depicted in FIG. 15, it is found that Voc of bottom cell 40C is 0.6 V on the assumption that the best crystallinity is attained.

TABLE 1

| | | Evaluation Sample Number | | | | | | | | |
|---|---|---|---|---|---|---|---|---|---|---|
| | | 1 (Example 1) | 2 (Example 2) | 3 (Example 3) | 4 (Example 4) | 5 (Example 5) | 6 (Comparative Example 1) | 7 (Comparative Example 2) | 8 (Comparative Example 3) | 9 (Comparative Example 4) |
| Two Adjacent Layers Closest to Middle Cell | Difference in Ga Composition x | 0.045 | 0.045 | 0.045 | 0.060 | 0.040 | 0.045 | 0.045 | 0.033 | 0.065 |
| | Difference in Lattice Constant [nm] | 0.00188 | 0.00188 | 0.00188 | 0.00251 | 0.00167 | 0.00188 | 0.00188 | 0.00138 | 0.00271 |
| | First Ratio of Difference in Lattice Constant [%] | 0.33 | 0.33 | 0.33 | 0.44 | 0.30 | 0.33 | 0.33 | 0.24 | 0.48 |

TABLE 1-continued

| | | Evaluation Sample Number | | | | | | | | |
|---|---|---|---|---|---|---|---|---|---|---|
| | | 1 (Example 1) | 2 (Example 2) | 3 (Example 3) | 4 (Example 4) | 5 (Example 5) | 6 (Comparative Example 1) | 7 (Comparative Example 2) | 8 (Comparative Example 3) | 9 (Comparative Example 4) |
| Other Two Adjacent Layers | Difference in Ga Composition x | 0.033 | 0.029 | 0.039 | 0.033 | 0.033 | 0.028 | 0.041 | 0.033 | 0.033 |
| | Difference in Lattice Constant [nm] | 0.00138 | 0.00121 | 0.00163 | 0.00138 | 0.00138 | 0.00117 | 0.00171 | 0.00138 | 0.00138 |
| Cross-sectional Condition (Bottom Cell 40 C.) | | A | A | A | A | A | C | C | B | B |
| Second Ratio of Difference in Lattice Constant [%] | | 0.39 | 0.15 | 0.74 | 0.50 | 0.35 | 0.09 | 0.86 | 0.30 | 0.53 |
| Voc [V] | | 0.61 | 0.61 | 0.59 | 0.57 | 0.57 | 0.42 | 0.41 | 0.54 | 0.53 |

Table 1 shows the difference in Ga composition x between two layers that are adjacent each other on the side closest to middle cell 40B within the buffer layer of each of Evaluation Samples Nos. 1 to 9, difference in Ga composition x between two adjacent layers at the other portions, difference in lattice constant [nm] converted from the difference in Ga composition x, first ratio of difference in lattice constant [%] represented by the following equation (i), evaluation of cross-sectional conditions of bottom cell 40C by means of cross-sectional TEM images, second ratio of difference in lattice constant [%] represented by the following equation (ii), and Voc of semiconductor layer 314 that reflects the characteristics of bottom cell 40C.

Herein, the first ratio of difference in lattice constant [%] is represented by the following equation (i):

First ratio of difference in lattice constant [%]=(100× (a1−a2))/(a1)　　(i)

In the above equation (i), lattice constant a2 is of a semiconductor layer (N+ type $In_{0.490}Ga_{0.510}P$ layer 21a in the example of FIG. 14) that is disposed at the closest position to middle cell 40B of the semiconductor layers configuring the buffer layer, and lattice constant a1 is of a semiconductor layer (N+ type $In_{0.535}Ga_{0.465}P$ layer 22a in the example of FIG. 14) that is adjacent to the semiconductor layer disposed at the position closest to middle cell 40B.

Lattice constant a1 and lattice constant a2 were found by conversion based on the composition ratio of elements of InGaP.

The second ratio of difference in lattice constant [%] is represented by the following equation (ii):

Second ratio of difference in lattice constant [%]= (100×(a3−a4))/(a3)　　(ii)

In the above equation (ii), lattice constant a3 is of a semiconductor layer (N type $In_{0.799}Ga_{0.201}P$ layer 30a in the example of FIG. 14) that is disposed at the closest position to bottom cell 40C of the semiconductor layers configuring the buffer layer, and lattice constant a4 is of a photoelectric conversion layer (the lattice constant of InGaAs) of bottom cell 40C.

Lattice constant a3 and lattice constant a4 were found by the X-ray diffractometry wherein X ray is applied from the bottom cell 40C side (the P type InGaAs layer 35 side in the longitudinal direction of FIG. 14 in the example of FIG. 14) in a condition immediately after epitaxial growth and before attachment of supporting substrate 101, and also before formation of second electrode 102.

Cross-sectional TEM images of bottom cell 40C were also observed in a condition immediately after epitaxial growth and before attachment of supporting substrate 101, and also before formation of second electrode 102. The symbols of the cross-sectional conditions of bottom cell 40C shown in Table 1 indicate the following:

A . . . Best Cross-sectional Condition

B . . . Favorable Cross-sectional Condition

C . . . Defective Cross-sectional Condition

In the case where the second ratio of difference in lattice constant [%] is greater than or equal to 0.12% and less than or equal to 0.80%, the best cross-sectional condition of bottom cell 40C is attained when the second ratio of difference in lattice constant [%] is desirably greater than or equal to 0.15% and less than or equal to 0.74%, according to the result of evaluation shown in Table 1 on Evaluation Samples Nos. 2 and 3.

It should be noted here that, as is seen from the result of evaluation shown in Table 1 on Evaluation Samples Nos. 8 and 9, the best cross-sectional condition of bottom cell 40C is not attained even when the second ratio of difference in lattice constant [%] is greater than or equal to 0.15% and less than or equal to 0.74%.

However, in the case where, of the semiconductor layers configuring buffer layer 41, two layers adjacent each other on the side closest to middle cell 40B has difference in lattice constant of greater than or equal to 0.0015 nm and less than or equal to 0.0026 nm, it is considered, as can be seen from the result of evaluation shown in Table 1 on Evaluation Samples Nos. 4 and 5, that the best cross-sectional condition of bottom cell 40C is achieved when the difference is desirably greater than or equal to 0.00167 nm and less than or equal to 0.00251 nm.

As can be understood from the above result of study, to obtain Eg=1.0 eV where the best Voc is achieved with respect to bottom cell 40C, a range needs to be defined not only for the second ratio of difference in lattice constant [%] but also for the difference in lattice constant between the two layers adjacent each other on the side closest to middle cell 40B.

In the buffer layer in which a plurality of semiconductor layers exists, where the difference in lattice constant between two adjacent layers is set to be greater than or equal to a certain value, crystal growth that has transited from two-dimensional growth to three-dimensional growth slightly takes place, in addition to a phenomenon of occurrence of dislocation. It is considered that, when this three-dimensional growth that has slightly occurred takes place in most of the two-dimensional growth, distortion is reduced and the crystallinity is improved. However, if the difference in lattice constant is set excessively large between two adjacent layers, the dislocation density grows, which invites degradation of crystallinity because the layers retain that dislocation density. Meanwhile, if the difference in lattice constant is set excessively small between two adjacent layers, nuclei of the three-dimensional growth hardly appear.

According to the above result of study, it is considered that the phenomenon of reduction in distortion by the occurrence of three-dimensional growth bringing about crystallinity enhancement as described above is achieved when a range is set such that difference in lattice constant is greater than or equal to 0.0015 nm and less than or equal to 0.0026 nm (desirably, greater than or equal to 0.00167 nm and less than or equal to 0.00251 nm) between, of the semiconductor layers configuring the buffer layer, two layers that are adjacent each other on the side closest to middle cell 40B.

It is considered that a semiconductor layer with good crystallinity is producible by inducing the above reduction in distortion, and that the crystallinity of bottom cell 40C is improved by stacking a semiconductor layer on that semiconductor layer.

As described above, since the area with improved crystallinity is preferably larger inside the buffer layer, the two adjacent layers in which reduction in distortion is to be induced are preferably at a position closer to middle cell 40B than to the center in the thickness direction of the buffer layer, and more preferably, at the position closest to middle cell 40B.

The embodiments and examples disclosed herein are illustrative in all respects, and it is considered that improvement in characteristic is achievable also in the case where an intermediate portion between two cells having different lattice constants is fabricated with the buffer layer that has been described as one embodiment of the present invention interposed therebetween, for use in, for example, double-junction, triple-junction, and quadruple junction multijunction compound semiconductor solar cells.

It should be appreciated that the embodiments and examples disclosed herein are illustrative in all respects and should not be considered to be restrictive. The scope of an embodiment of the present invention is solely defined by the appended claims and not by the foregoing description, and it is intended that all changes and modifications are encompassed within the equivalent meaning of and within the scope of the appended claims.

INDUSTRIAL APPLICABILITY

An embodiment of the present invention is widely applicable to general multijunction compound semiconductor solar cells.

REFERENCE SIGNS LIST

21a N+ type $In_{0.490}Ga_{0.510}P$ layer, 22a N type $In_{0.535}Ga_{0.465}P$ layer, 23a N type $In_{0.568}Ga_{0.432}P$ layer, 24a N type $In_{0.601}Ga_{0.399}P$ layer, 25a N type $In_{0.634}Ga_{0.366}P$ layer, 26a N type $In_{0.667}Ga_{0.333}P$ layer, 27a N type $In_{0.700}Ga_{0.300}P$ layer, 28a N type $In_{0.733}Ga_{0.267}P$ layer, 29a N type $In_{0.766}Ga_{0.234}P$ layer, 30a N type $In_{0.799}Ga_{0.201}P$ layer, 21b N+ type $In_{0.490}Ga_{0.510}P$ layer, 22b N type $In_{0.535}Ga_{0.465}P$ layer, 23b N type $In_{0.564}Ga_{0.436}P$ layer, 24b N type $In_{0.593}Ga_{0.407}P$ layer, 25b N type $In_{0.622}Ga_{0.378}P$ layer, 26b N type $In_{0.651}Ga_{0.349}P$ layer, 27b N type $In_{0.680}Ga_{0.320}P$ layer, 28b N type $In_{0.709}Ga_{0.291}P$ layer, 29b N type $In_{0.738}Ga_{0.262}P$ layer, 30b N type $In_{0.767}Ga_{0.233}P$ layer, 21c N+ type $In_{0.490}Ga_{0.510}P$ layer, 22c N type $In_{0.535}Ga_{0.465}P$ layer, 23c N type $In_{0.574}Ga_{0.426}P$ layer, 24c N type $In_{0.613}Ga_{0.387}P$ layer, 25c N type $In_{0.652}Ga_{0.348}P$ layer, 26c N type $In_{0.691}Ga_{0.309}P$ layer, 27c N type $In_{0.730}Ga_{0.270}P$ layer, 28c N type $In_{0.769}Ga_{0.231}P$ layer, 29c N type $In_{0.808}Ga_{0.192}P$ layer, 30c N type $In_{0.847}Ga_{0.153}P$ layer, 21d N+ type $In_{0.490}Ga_{0.510}P$ layer, 22d N type $In_{0.550}Ga_{0.450}P$ layer, 23d N type $In_{0.583}Ga_{0.417}P$ layer, 24d N type $In_{0.616}Ga_{0.384}P$ layer, 25d N type $In_{0.649}Ga_{0.351}P$ layer, 26d N type $In_{0.682}Ga_{0.318}P$ layer, 27d N type $In_{0.715}Ga_{0.285}P$ layer, 28d N type $In_{0.748}Ga_{0.252}P$ layer, 29d N type $In_{0.781}Ga_{0.219}P$ layer, 30d N type $In_{0.814}Ga_{0.186}P$ layer, 21e N+ type $In_{0.490}Ga_{0.510}P$ layer, 22e N type $In_{0.530}Ga_{0.470}P$ layer, 23e N type $In_{0.563}Ga_{0.437}P$ layer, 24e N type $In_{0.596}Ga_{0.404}P$ layer, 25e N type $In_{0.629}Ga_{0.371}P$ layer, 26e N type $In_{0.662}Ga_{0.338}P$ layer, 27e N type $In_{0.695}Ga_{0.305}P$ layer, 28e N type $In_{0.728}Ga_{0.272}P$ layer, 29e N type $In_{0.761}Ga_{0.239}P$ layer, 30e N type $In_{0.794}Ga_{0.206}P$ layer, 30 semiconductor layer, 31 window layer, 32 emitter layer, 33 base layer, 34 BSF layer, 35 contact layer, 40A top cell, 40B middle cell, 40C bottom cell, 41A buffer layer, 41B buffer layer, 41C buffer layer, 41D buffer layer, 41E buffer layer, 50A tunnel junction layer (first tunnel junction layer), 50B tunnel junction layer (second tunnel junction layer), 60A, 60B, 60C photoelectric conversion layer, 101 supporting substrate, 102 second electrode, 110 N+ type AlInP layer, 111 N++ type $In_{0.490}Ga_{0.510}P$ layer, 112 P++ type AlGaAs layer, 113 P+ type AlInP layer, 114 BSF layer, 115 base layer, 116 emitter layer, 117 window layer, 118 N+ type AlInP layer, 119 N++ type $In_{0.490}Ga_{0.510}P$ layer, 120 P++ type AlGaAs layer, 121 P+ type AlInP layer, 122 BSF layer, 123 base layer, 124 emitter layer, 125 window layer, 126 contact layer, 127 anti-reflection film, 128 first electrode, 131 etching stopper layer, 151 metal layer, 301 first cell, 302 second cell, 303 buffer layer, 304 first electrode, 305 second electrode, 306 multi-junction cell, 307 supporting substrate, 308 semiconductor substrate, 309 etching stopper layer, 310 etching stopper layer, 311 etching layer, 312 etching stopper layer, 313 multijunction cell, 314 semiconductor layer, 315 electrode layer, 316A Evaluation Sample No. 1, 321 metal layer, 501 top cell, 502 middle cell, 503 buffer layer, 503A buffer layer, 503B buffer layer, 504 bottom cell, 505 first electrode, 506 second electrode, 507 semiconductor substrate.

The invention claimed is:
1. A multijunction compound semiconductor solar cell, comprising:
a first electrode;
a first cell;
a buffer layer;
a second cell; and
a second electrode, wherein
said first electrode is disposed on a side on which solar light is to be incident, said first electrode, said first cell, said buffer layer, said second cell and said second electrode being disposed in this order,
said first cell includes a first photoelectric conversion layer,
said second cell includes a second photoelectric conversion layer,
said first photoelectric conversion layer is higher in bandgap from said second photoelectric conversion layer,
said second cell is larger in lattice constant than said first cell,
said buffer layer includes a plurality of semiconductor layers,
said plurality of semiconductor layers is arranged such that lattice constants thereof have larger values in order from the side of said first cell to the side of said second cell,
of said plurality of semiconductor layers, a semiconductor layer closest to said second cell is larger in lattice constant than said second cell, and of said plurality of semiconductor layers, two layers having the largest difference in lattice constant among each two adjacent layers are at a position closer to said first cell than the center in the thickness direction of said buffer layer.

2. The multijunction compound semiconductor solar cell according to claim 1, wherein
said two layers having the largest difference in lattice constant among each two adjacent semiconductor layers are two layers closest to said first cell.

3. The multijunction compound semiconductor solar cell according to claim 1, wherein
where, of said two layers having the largest difference in lattice constant among each two adjacent semiconductor layers, the semiconductor layer on the side of said second cell has a lattice constant a1, and the semiconductor layer on the side of said first cell has a lattice constant a2,
difference in lattice constant between said lattice constant a1 and said lattice constant a2 is greater than or equal to 0.0015 nm and less than or equal to 0.0026 nm.

4. The multijunction compound semiconductor solar cell according to claim 1, wherein
where said second photoelectric conversion layer of said second cell has a lattice constant a4, and the semiconductor layer closest to said second cell has a lattice constant a3, and a second ratio of difference in lattice constant (%)=(100×(a3−a4))/(a3),
the second ratio of difference in lattice constant is greater than or equal to 0.12% and less than or equal to 0.8%.

5. A multijunction compound semiconductor solar cell, comprising:
a first electrode;
a first cell disposed under the first electrode;
a buffer layer disposed under the first cell;
a second cell disposed under the buffer layer; and
a second electrode disposed under the second cell in this order,
said first cell includes a first photoelectric conversion layer,
said second cell includes a second photoelectric conversation layer,
said first photoelectric conversion layer is higher in bandgap form said second photoelectric conversion layer,
said second cell is larger in lattice constant than said first cell,
said buffer layer includes a plurality of semiconductor layers,
said plurality of semiconductor layers is arranged such that lattice constants thereof have larger values in order from the side of said first cell to the side of said second cell,
of said plurality of semiconductor layers, a semiconductor layer closest to said second cell is larger in lattice constant than said second cell, and
of said plurality of semiconductor layers, two layers having the largest difference in lattice constant among each two adjacent layers are at a position closer to said first cell than the center in the thickness direction of said buffer layer.

* * * * *